(12) United States Patent
Lee

(10) Patent No.: US 12,456,435 B2
(45) Date of Patent: Oct. 28, 2025

(54) DISPLAY DEVICE AND DISPLAY PANEL

(71) Applicant: LG DISPLAY CO., LTD., Seoul (KR)

(72) Inventor: Youngjae Lee, Seoul (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/382,264

(22) Filed: Oct. 20, 2023

(65) Prior Publication Data

US 2024/0203365 A1 Jun. 20, 2024

(30) Foreign Application Priority Data

Dec. 15, 2022 (KR) .......................... 10-2022-0175794

(51) Int. Cl.
*G09G 3/3291* (2016.01)

(52) U.S. Cl.
CPC ... *G09G 3/3291* (2013.01); *G09G 2300/0426* (2013.01); *G09G 2320/0223* (2013.01)

(58) Field of Classification Search
CPC ......... G09G 3/3291; G09G 2320/0223; G09G 2300/0426
See application file for complete search history.

(56) References Cited

U.S. PATENT DOCUMENTS

| | | | |
|---|---|---|---|
| 2014/0183567 A1* | 7/2014 | Han | G02F 1/13452 438/28 |
| 2019/0206894 A1* | 7/2019 | Lee | G09G 3/20 |
| 2023/0110850 A1* | 4/2023 | Wang | H10K 59/131 257/72 |
| 2023/0352391 A1* | 11/2023 | Mi | H01L 23/49827 |
| 2023/0371307 A1* | 11/2023 | Lee | H10K 59/121 |

* cited by examiner

*Primary Examiner* — Christopher E Leiby

(74) *Attorney, Agent, or Firm* — Fish & Richardson P.C.

(57) ABSTRACT

A display panel includes a plurality of subpixels; a first data line group disposed in a first area corresponding to a data driving circuit; a second data line group disposed in a second area located on outside of the first area; a plurality of gate lines; a first data link line group having a linear structure connected to the first data line group in a bezel area; and a second data link line group with a bending structure including (2–3)th data link lines formed in a stepped structure for connecting the second data line group.

23 Claims, 16 Drawing Sheets

(a)

(b)

DISPLAY DEVICE AND DISPLAY PANEL

CROSS-REFERENCE TO RELATED APPLICATION

This application claims the priority of Korean Patent Application No. 10-2022-0175794, filed on Dec. 15, 2022, which is hereby incorporated by reference in its entirety.

BACKGROUND

Field of the Disclosure

The present disclosure relates to a display device and a display panel and, more particularly, to a display device and a display panel capable of implementing a narrow bezel and improving image quality by reducing the coupling capacitance due to data link lines disposed in the display area of the display panel.

Description of the Background

In response to the development of the information society, a variety of demands for image display devices are increasing. In this regard, a range of display devices, such as liquid crystal display (LCD) devices, quantum-dot light emitting display device, field emission display device, plasma display device, electrophoretic display device, inorganic light-emitting display devices and organic light-emitting display devices, have recently come into widespread use.

Among such display devices, organic light-emitting display devices are advantageous in terms of rapid response rates, high contrast ratios, high emission efficiency, high luminance, wide viewing angles, and the like since organic light-emitting diodes emitting light by themselves are used therein.

Such an organic light-emitting display device may include organic light-emitting diodes (OLEDs) disposed in a plurality of subpixels arrayed in a display panel, and may control the OLEDs to emit light by controlling current flowing through the OLEDs, thereby displaying an image while controlling the luminance of the subpixels.

In such display devices, research into minimizing or reducing the width of the bezel formed outside a display area is being actively undertaken to reduce the overall weight and size of a display device and to make the appearance of the display device more aesthetically appealing.

SUMMARY

Accordingly, the present disclosure is directed to a display device and a display panel that substantially obviate one or more of problems due to limitations and disadvantages described above.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure is to provide a display device and a display panel capable of implementing a narrow bezel and improving image quality.

In addition, the present disclosure is to provide a display device and a display panel capable of implementing a narrow bezel and improving image quality by reducing the coupling capacitance due to data link lines disposed in the display area of the display panel.

Further, the present disclosure is provide a display device and a display panel capable of implementing a narrow bezel and improving image quality by forming a part of data link lines located in a display area of a display panel in stepped structures.

To achieve these and other advantages and in accordance with the present disclosure, as embodied and broadly described, a display device includes a data driving circuit configured to supply a plurality of data voltages to a plurality of data lines; a gate driving circuit configured to supply a plurality of gate signals to a plurality of gate lines; a display panel having a first data line group disposed in a first area corresponding to the data driving circuit, and a second data line group disposed in a second area located on outside of the first area; a timing controller configured to control the data driving circuit and the gate driving circuit; wherein the display panel includes a first data link line group $i^{th}$ a linear structure connecting to the first data line group; and a second data link line group with a bending structure including $(2-3)^{th}$ data link lines formed in a stepped structure for connecting the second data line group.

In another aspect of the present disclosure, a display panel includes a plurality of subpixels; a first data line group disposed in a first area corresponding to a data driving circuit; a second data line group disposed in a second area located on outside of the first area; a plurality of gate lines; a first data link line group having a linear structure connected to the first data line group in a bezel area; and a second data link line group with a bending structure including $(2-3)^{th}$ data link lines formed in a stepped structure for connecting the second data line group.

According to various aspects of the present disclosure, the display device and the display panel may implement a narrow bezel and improve the image quality.

According to various aspects of the present disclosure, the display device and the display panel may implement a narrow bezel and improve image quality by reducing the coupling capacitance due to data link lines disposed in the display area of the display panel.

According to various aspects of the present disclosure, the display device and the display panel may implement a narrow bezel and improve image quality by forming a part of data link lines located in a display area of a display panel in stepped structures.

It is to be understood that both the foregoing general description and the following detailed description are exemplary and explanatory and are intended to provide further explanation of the disclosure as claimed.

BRIEF DESCRIPTION OF THE DRAWINGS

The above and other features and advantages of the present disclosure will be more clearly understood from the following detailed description, taken in conjunction with the accompanying drawings, in which.

DETAILED DESCRIPTION

Figure 1:
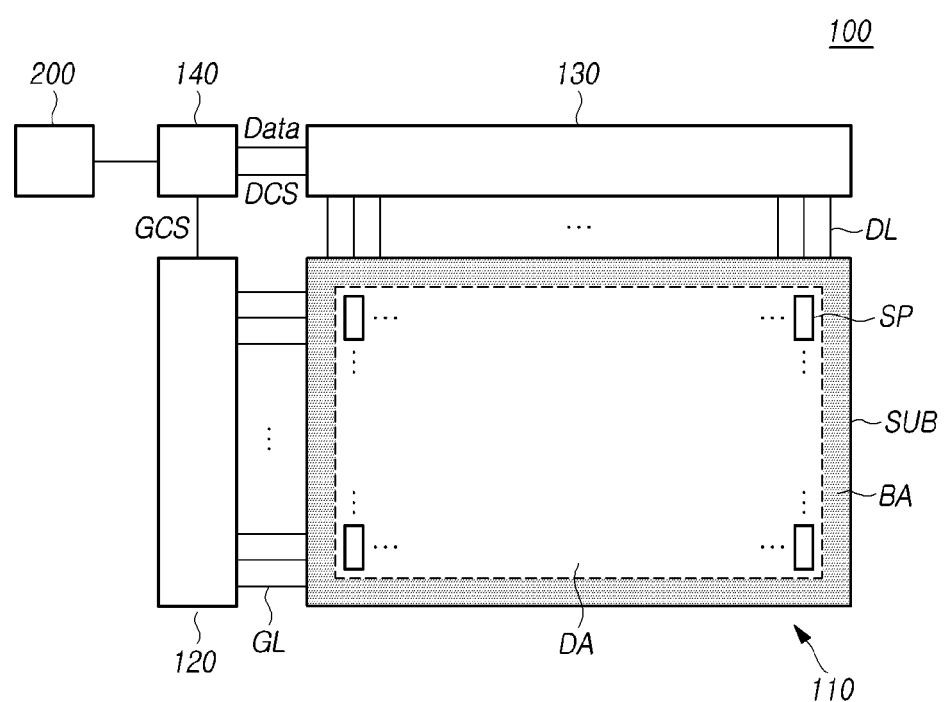
FIG. 1 is a diagram schematically illustrating a display device according to aspects.

Hereinafter, some aspects of the present disclosure will be described in detail with reference to exemplary drawings. In the following description of examples or aspects of the present disclosure, reference will be made to the accompanying drawings in which it is shown by way of illustration specific examples or aspects that may be implemented, and in which the same reference numerals and signs may be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting", "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only may the first element "be directly connected or coupled to" or "directly contact or overlap" the second element, but a third element may also be "interposed" between the first and second elements, or the first and second elements may "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "may".

Hereinafter, various aspects of the present disclosure will be described in detail with reference to the accompanying drawings.

FIG. 1 is a diagram schematically illustrating a display device according to aspects.

Referring to FIG. 1, a display device 100 according to aspects may include a display panel 110 and a driving circuit for driving the display panel 110.

The display panel 110 may include a display area DA on which images are displayed and a bezel area BA on which no images are displayed. The bezel area BA may also be referred to as an edge area or a non-display area which may be an area outside of the display area DA (for example, in the vicinity of the display area DA or entirely or partly surrounding the display area DA.

The display panel 110 may include a plurality of subpixels SP to display images. For example, the plurality of subpixels SP may be disposed in the display area DA. In some cases, at least one subpixel SP may be disposed in the bezel area BA. The at least one subpixel SP disposed in the bezel area BA is referred to as a dummy subpixel.

The display panel 110 may include a plurality of signal lines to drive the plurality of subpixels SP. For example, the plurality of signal lines may include a plurality of data lines DL and a plurality of gate lines GL. The signal lines may further include other signal lines than the plurality of data lines DL and the plurality of gate lines GL according to the structure of the subpixels SP. For example, the other signal lines may include driving voltage lines, reference voltage lines, touch sensing line, initialization voltage lines, and the like.

The plurality of data lines DL may intersect the plurality of gate lines GL. Each of the plurality of data lines DL may be disposed to extend in a first direction. Each of the plurality of gate lines GL may be disposed to extend in a second direction. Here, the first direction may be a column direction, while the second direction may be a row direction. In this specification, the column direction and the row direction are relative terms. In an example, the column direction may be a vertical direction, while the row direction may be a horizontal direction. In another example, the column direction may be a horizontal direction, while the row direction may be a vertical direction. In addition, the first direction is not necessarily vertical with the second direction.

The driving circuit may include a data driving circuit 130 to drive the plurality of data lines DL and a gate driving circuit 120 to drive the plurality of gate lines GL. The driving circuit may further include a timing controller 140 to control the data driving circuit 130 and the gate driving circuit 120.

The data driving circuit 130 is a circuit to drive the plurality of data lines DL, and may receive data signal from the timing controller 140, convert the data signal into an analog data voltage Vdata and output converted data signals (also referred to as data voltages) corresponding to an image signal to the plurality of data lines DL according to the timing at which the scan signal is applied through the gate line GL. The gate driving circuit 120 is a circuit to drive the plurality of gate lines GL, and may generate gate signals and output the gate signals to the plurality of gate lines GL. The gate signals may include one or more scan signals and an emission signal. The gate driving circuit 120 may supply a scan signal to the subpixel SP through the gate line GL. The gate driving circuit 120 may control the driving timing of the subpixel SP by the scan signal.

The timing controller 140 may start scanning in timing set for respective frames and control data driving at appropriate points in time in response to the scanning. The timing controller 140 may convert image data input from an external source such as a host system 200 into image data Data having a data signal format readable by the data driving circuit 130 and output the image data Data to the data driving circuit 130.

The timing controller 140 may receive the input image data and display driving control signals synchronized therewith from a host system 200. For example, the display drive control signals may include a vertical synchronization signal, a horizontal synchronization signal, an input data enable signal, a clock signal, and the like.

The timing controller 140 may generate a data drive control signal DCS and a gate drive control signal GCS on the basis of the display drive control signals input from the host system 200. The timing controller 140 may control the drive operation and the drive timing of the data driving circuit 130 by supplying the data drive control signal DCS to the data driving circuit 130. The timing controller 140 may control the drive operation and the drive timing of the gate driving circuit 120 by supplying the gate drive control signal GCS to the gate driving circuit 120.

Figure 2:
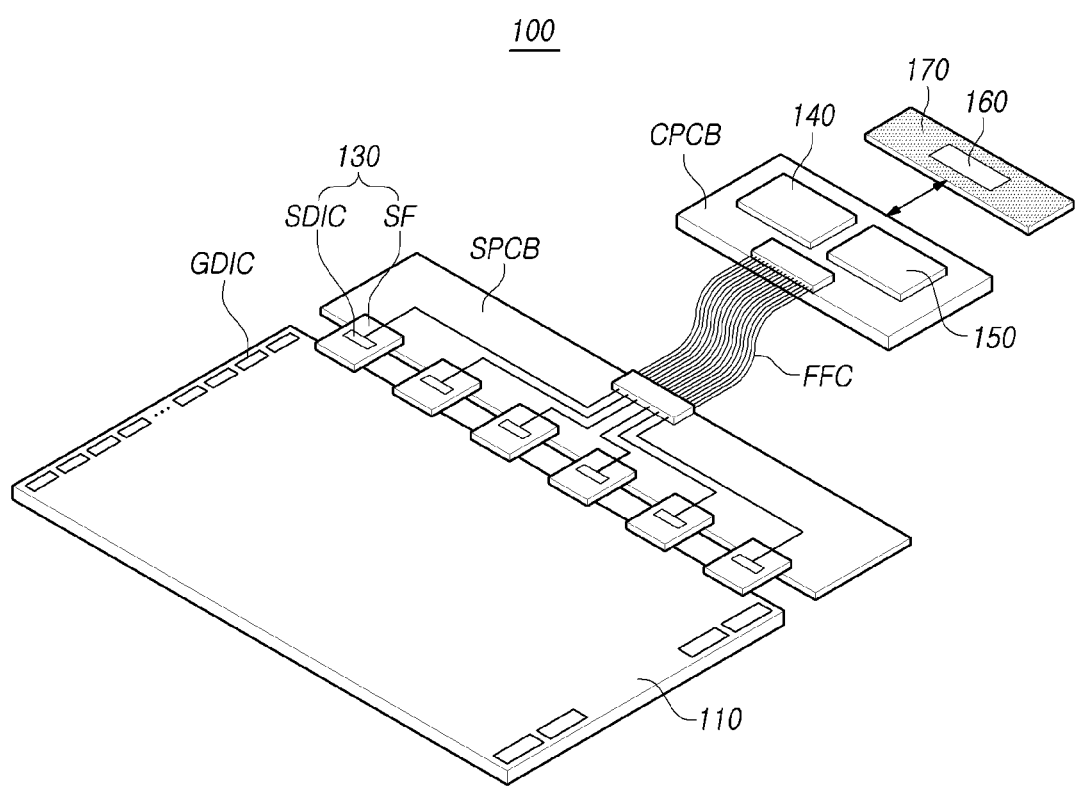
FIG. 2 is an example diagram illustrating a system of the display device according to aspects.

The data driving circuit 130 may include one or more source driving integrated circuits SDIC (shown in FIG. 2). Each of the source driving integrated circuits SDIC may include a shift register, a latch circuit, a digital-to-analog converter (DAC), an output buffer, and the like. Each of the source driving integrated circuits SDIC may further include an analog-to-digital converter (ADC).

For example, each of the source driving integrated circuits SDIC may be connected to the display panel 110 using a tape-automated bonding (TAB) structure, may be connected to a bonding pad of the display panel 110 using a chip-on-glass (COG) structure or a chip-on-panel COP structure, or may be implemented using a chip-on-film (COF) structure connected to the display panel 110. In this case, each source driving integrated circuit SDIC may be mounted on a film connected to the display panel 110, and may be electrically connected to the display panel 110 through lines on the film. Alternatively, each source driving integrated circuit SDIC may be disposed directly on the display panel 110. Alternatively, each source driving integrated circuit SDIC may be integrated and disposed on the display panel 110 in some cases.

The gate driving circuit 120 may output a gate signal having a turn-on-level voltage or a gate signal having a turn-off-level voltage under the control of the timing controller 140. The gate driving circuit 120 may sequentially drive the plurality of gate lines GL by sequentially supplying the gate signal having a turn-on-level voltage to the plurality of gate lines GL. The turn-on-level voltage may be a low-level voltage or high-level voltage depending on the type of transistors. In particular, when the transistors are p-type transistors, the turn-on-level voltage will be a low-level voltage, and the turn-off-level voltage will be a high-level voltage. When the transistors are n-type transistors, the turn-on-level voltage will be a high-level voltage, and the turn-off-level voltage will be a low-level voltage.

The gate driving circuit 120 may include one or more gate driving integrated circuits GDIC (shown in FIG. 2).

The gate driving circuit 120 may be connected to the display panel 110 using a TAB structure, connected to bonding pads of the display panel 110 using a COG structure or a COP structure, or connected to the display panel 110 using a COF structure to be mounted on a film connected to the display panel 110. Alternatively, the gate driving circuit 120 may be implemented using a gate-in-panel (GIP) structure provided in the bezel area BA of the display panel 110. The gate driving circuit 120 may be disposed on a circuit board or connected to the circuit board. That is, when the gate driving circuit 120 has a GIP structure, the gate driving circuit 120 may be disposed in the bezel area BA. When the gate driving circuit 120 has a COG structure, a COF structure, or the like, the gate driving circuit 120 may be connected to the circuit board. Alternatively, each gate driving integrated circuit GDIC may be integrated and disposed on the display panel 110 in some cases.

In addition, at least one driving circuit of the data driving circuit 130 and the gate driving circuit 120 may be disposed in the display area DA. For example, at least one driving circuit of the data driving circuit 130 and the gate driving circuit 120 may be disposed to not overlap with the subpixels SP or disposed such that a portion or the entirety thereof overlaps with the subpixels SP.

The data driving circuit 130 may be connected to one side (e.g., the upper side or the lower side) of the display panel 110. The data drive data driving circuit 130 may be connected to both sides (e.g., the upper side and the lower side) of the display panel 110 or two or more sides of four sides of the display panel 110, depending on the driving method, the design of the display panel, or the like.

The gate driving circuit 120 may be connected to one side (e.g., the left side or the right side) of the display panel 110. The gate driving circuit 120 may be connected to both sides (e.g., the left side and the right side) of the display panel 110 or two or more sides of four sides of the display panel 110, depending on the driving method, the design of the display panel, or the like.

The timing controller 140 may be provided as a component separate from the data driving circuit 130 or may be combined with the data driving circuit 130 to form an integrated circuit (IC). The timing controller 140 may be a timing controller used in typical display technology, may be a control device including a timing controller and performing other control functions, or may be a circuit in the control device. The timing controller 140 may be implemented as any of a variety of circuits or electronic components such as an IC, a field programmable gate array (FPGA), an application specific integrated circuit (ASIC), a digital signal processor (DSP), a digital signal processing device (DSPD), a programmable logic device (PLD), or a processor.

The timing controller 140 may be mounted on a printed circuit board (PCB), a flexible printed circuit (FPC), or the like, and may be electrically connected to the data driving circuit 130 and the gate driving circuit 120 through the PCB, the FPC, or the like. The timing controller 140 may transmit and receive signals to and from the data driving circuit 130 according to predetermined one or more interfaces. Here, for example, the interfaces may include a low voltage differential signaling (LVDS) interface, an embedded panel interface (EPI), a serial peripheral (SP) interface, a Transition Minimized Differential Signaling (TMDS), and the like.

The display device 100 according to aspects may be a self-light-emitting display device in which the display panel 110 emits light by itself. When the display device 100 according to aspects is a self-light-emitting display device, each of the plurality of subpixels SP may include a light-emitting element. In an example, the display device 100 according to aspects may be an organic light-emitting display device in which light-emitting elements are organic light-emitting diodes (OLEDs). In another example, the display device 100 according to aspects may be an inorganic light-emitting display device in which light-emitting elements are light-emitting diodes (LEDs) based on an inorganic material. In another example, the display device 100 according to aspects may be a quantum dot display device in which light-emitting elements are quantum dots serving as self-light-emitting semiconductor crystals.

FIG. 2 is an example diagram illustrating a system of the display device according to aspects.

Referring to FIG. 2, the display device 100 according to aspects is an example in which the data driving circuit 130 is implemented using a COF structure from among a variety of structures such as TAB, COG, and COF structures, and the gate driving circuit 120 is implemented using a GIP structure from among a variety of structures such as TAB, COG, COF, and GIP structures.

When the gate driving circuit 120 has the GIP structure, the plurality of gate driving integrated circuits GDIC of the gate driving circuit 120 may be directly formed in the bezel area of the display panel 110. In FIG. 2, the plurality of gate driving integrated circuits GDIC are shown as being formed on the left and right sides of the display panel 110. However, the present disclosure is not limited thereto. The plurality of gate driving integrated circuits GDIC may also be formed on the at least one other side of the display panel 110. Here, the gate driving integrated circuits GDIC may be provided with a variety of signals (e.g., a clock, a gate high signal, and a gate low signal) required for generation of scan signals through gate driving-related signal lines disposed in the bezel area.

In the same manner, the source driving integrated circuits SDIC of the data driving circuit 130 may be mounted on source films SF, respectively. One side of each of the source films SF may be electrically connected to the display panel 110. In addition, conductive lines electrically connecting the source driving integrated circuits SDIC to the display panel 110 may be disposed on the top portions of the source films SF.

The display device 100 may include at least one source printed circuit board SPCB and a control printed circuit board CPCB for circuit connection of the plurality of source driving integrated circuits SDIC to other devices. Here, control components and a variety of electrical devices may be mounted on the control printed circuit board CPCB.

Here, the other sides of the source films SF on which the source driving integrated circuits SDIC are mounted may be connected to the source printed circuit board SPCB. That is, each of the source films SF on which the source driving integrated circuits SDIC are mounted may be configured such that one side thereof is electrically connected to the display panel 110 and the other side thereof is electrically connected to the source printed circuit board SPCB.

The timing controller 140 and a power management circuit 150 may be mounted on the control printed circuit board CPCB. The timing controller 140 may control the operation of the data driving circuit 130 and the gate driving circuit 120. The power management circuit 150 may supply a driving voltage or current to the display panel 110, the data driving circuit 130, the gate driving circuit 120, and the like and may control the supplied voltage or current.

The source printed circuit board (SPCB) and the control printed circuit board CPCB may be circuit-connected to each other through at least one connecting member. The connecting member may be, for example, a flexible flat cable (FFC), a flexible printed circuit (FPC), or the like. In addition, the source printed circuit board SPCB and the control printed circuit board CPCB may be integrated into a single printed circuit board (PCB).

The display device 100 may further include a set board 170 electrically connected to the control printed circuit board CPCB. Here, the set board 170 may also be referred to as a power board. The set board 170 may be provided with a main power management circuit 160 to manage the overall power of the display device 100. The main power management circuit 160 may work in concert with the power management circuit 150.

In the display device 100 having the above-described configuration, a driving voltage is generated by the set board 170 and is transferred to the power management circuit 150 in the control printed circuit board CPCB. The power management circuit 150 transfers the driving voltage, required for display driving or characteristic value sensing, to the source printed circuit board SPCB through the flexible printed circuit or the flexible flat cable FFC. The driving voltage transferred to the source printed circuit board SPCB is supplied through the driving integrated circuits SDIC to light or sense a specific subpixel SP in the display panel 110.

Here, each of the subpixels SP arrayed in the display panel 110 of the display device 100 may include a light-emitting element and circuit elements, such as a driving transistor, for driving the light-emitting element.

The type and number of the circuit elements provided in each of the subpixels SP may be determined variously depending on functions to be provided, designs, and the like.

Figure 3:
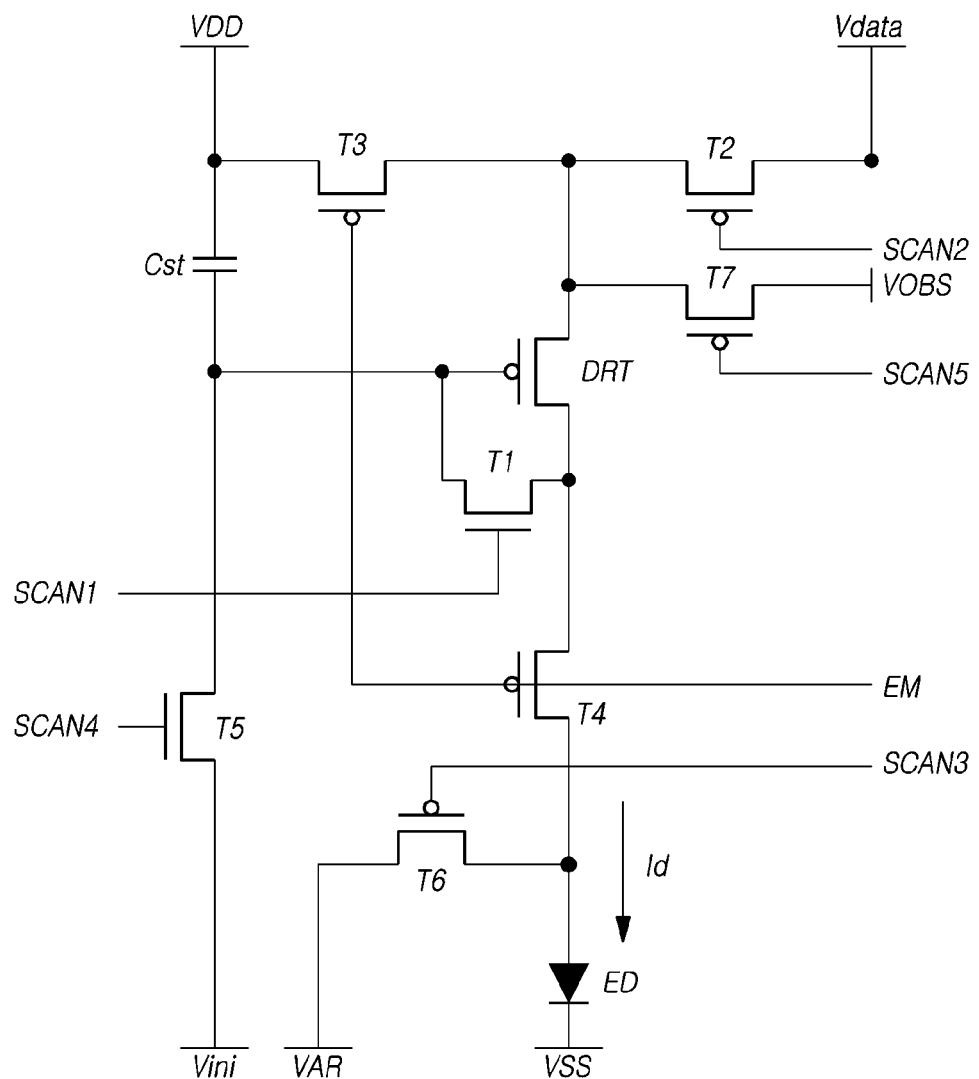
FIG. 3 is a diagram illustrating a subpixel circuit in the display device according to aspects.

FIG. 3 is a diagram illustrating a subpixel circuit in the display device according to aspects.

Referring to FIG. 3, a subpixel SP in the display device 100 according to aspects may include first to seventh switching transistors T1 to T7, a driving transistor DRT, a storage capacitor Cst, and a light-emitting element ED.

Here, the light-emitting element ED may be, for example, a self-light-emitting element, such as an organic light emitting diode (OLED), able to emit light by itself.

In the subpixel SP according to some aspects, the second to fourth switching transistors T2 to T4, the sixth switching transistor T6, the seventh switching transistor T7, and the driving transistor DRT may be P-type transistors, while the first switching transistor T1 and the fifth switching transistor T5 may be N-type transistors.

P-type transistors are more reliable than N-type transistors. P-type transistors have an advantage in that current flowing through the light-emitting element ED is not fluctuated by the capacitor Cst, since the source electrode may be fixed to a high-potential driving voltage VDD during lighting. Thus, it is easy to reliably supply current.

When a P-type transistor is connected to the anode of the light-emitting element ED and operates in a saturation region, a predetermined amount of current may be flown irrespective of changes in the threshold voltage. Thus, reliability is relatively high.

In this structure of the subpixel SP, each of the N-type transistors T1 and T5 may be formed of an oxide transistor (e.g., a transistor having a channel formed from an oxide semiconductor such as an In, Ga, or Zn oxide and an indium gallium zinc oxide (IGZO)) formed using a semiconducting oxide, while each of the P-type transistors DRT, T2 to T4, T6, and T7 may be a silicon (Si) transistor (e.g., a transistor referred to as a low-temperature polycrystalline silicon (LTPS) transistor having a poly-Si channel formed using a low-temperature process) formed from a transistor material such as Si.

The oxide transistor is characterized by a lower leakage current than the silicon transistor. Thus, when a transistor is formed of an oxide transistor, a leakage current from the gate electrode of the driving transistor DRT may be prevented, thereby reducing defects in image quality such as flicker.

In addition, each of the P-type transistors DRT, T2 to T4, T6, and T7, except for the N-type transistors such as the first switching transistor T1 and the fifth switching transistor T5, may be formed of an LTPS transistor.

The source electrode and the drain electrode of each of the switching transistors may be referred to as a drain electrode and a source electrode depending on the input voltage.

The gate electrode of the first switching transistor T1 is provided with a first scan signal SCAN1. The drain electrode of the first switching transistor T1 is connected to the gate electrode of the driving transistor DRT. In addition, the source electrode of the first switching transistor T1 is connected to the drain electrode of the driving transistor DRT.

The first switching transistor T1 is turned on by the first scan signal SCAN1 to maintain the gate voltage of the driving transistor DRT constant using the storage capacitor Cst, one terminal of which is fixed to the high-potential driving voltage VDD.

The first switching transistor T1 may be formed of an N-type MOS transistor to form an oxide transistor. Since N-type MOS transistors use electrons as carriers instead of holes, N-type MOS transistors may have higher mobility and thus higher switching speeds than P-type MOS transistors.

The gate electrode of the second switching transistor T2 is provided with a second scan signal SCAN2. The source electrode of the second switching transistor T2 may be provided with a data voltage Vdata. The drain electrode of the second switching transistor T2 is connected to the source electrode of the driving transistor DRT.

The second switching transistor T2 is turned on by the second scan signal SCAN2 to supply the data voltage Vdata to the source electrode of the driving transistor DRT.

The gate electrode of the third switching transistor T3 is provided with an emission signal EM. The source electrode of the third switching transistor T3 is provided with the high-potential driving voltage VDD. The drain electrode of the third switching transistor T3 is connected to the source electrode of the driving transistor DRT.

The third switching transistor T3 is turned on by the emission signal EM to supply the high-potential driving voltage VDD to the source electrode of the driving transistor DRT.

The gate electrode of the fourth switching transistor T4 is provided with the emission signal EM. The source electrode of the fourth switching transistor T4 is connected to the drain electrode of the driving transistor DRT. The drain electrode of the fourth switching transistor T4 is connected to the anode of the light-emitting element ED.

The fourth switching transistor T4 is turned on by the emission signal EM to supply a driving current Id to the anode of the light-emitting element ED. Gate electrodes of the third and fourth switching transistor T3 and T4 may be commonly connected to an emission signal line that supplies the emission signal EM.

The gate electrode of the fifth switching transistor T5 is provided with a fourth scan signal SCAN4.

Here, the fourth scan signal SCAN4 may be a signal having a different phase from the first scan signal SCAN1 supplied to a subpixel SP in another position. For example, when the first scan signal SCAN1 is applied to the nth gate line, the fourth scan signal SCAN4 may be a first scan signal SCAN1[n−1] applied to the (n−1)th gate line. That is, the fourth scan signal SCAN4 may use the first scan signal SCAN1, the gate line GL of which differs depending on the phase at which the display panel 110 is driven.

The drain electrode of the fifth switching transistor T5 is provided with a stabilization voltage Vini. The source electrode of the fifth switching transistor T5 is connected to the gate electrode of the driving transistor DRT and the storage capacitor Cst.

The fifth switching transistor T5 is turned on by the fourth scan signal SCAN4 to supply a stabilization voltage Vini to the gate electrode of the driving transistor DRT.

The gate electrode of the sixth switching transistor T6 is provided with a third scan signal SCAN3.

The source electrode of the sixth switching transistor T6 is provided with a reset voltage VAR. The drain electrode of the sixth switching transistor T6 is connected to the anode of the light-emitting element ED.

The sixth switching transistor T6 is turned on by the third scan signal SCAN3 to supply the reset voltage VAR to the anode of the light-emitting element ED.

The gate electrode of the seventh switching transistor T7 is provided with a fifth scan signal SCAN5.

The source electrode of the seventh switching transistor T7 is provided with a bias voltage VOBS. The drain electrode of the seventh switching transistor T7 is connected to the source electrode of the driving transistor DRT.

Here, the fifth scan signal SCAN5 may be a signal having a different phase from the third scan signal SCAN3 supplied to a subpixel SP in another position. For example, when the third scan signal SCAN3 is applied to the nth gate line, the fifth scan signal SCAN5 may be a third scan signal SCAN3 applied to the (n−1)th gate line. That is, the fifth scan signal SCAN5 may use the third scan signal SCAN3, the gate line GL of which differs depending on the phase at which the display panel 110 is driven.

In addition, since the fifth scan signal SCAN5 is a signal for applying the bias voltage VOBS to the driving transistor DRT, the fifth scan signal SCAN5 may be distinguished from the second scan signal SCAN2 for applying the data voltage Vdata.

The gate electrode of the driving transistor DRT is connected to the drain electrode of the first switching transistor T1. The source electrode of the driving transistor DRT is connected to the drain electrode of the second switching transistor T2. The drain electrode of the driving transistor DRT is connected to the source electrode of the first switching transistor T1.

The driving transistor DRT is turned on due to the difference in voltage between the source electrode and the drain electrode, and thus the driving current Id is applied to the light-emitting element ED.

The source electrode and the drain electrode of the first switching transistor T1 are connected to the drain electrode and the gate electrode of the driving transistor DRT, respectively. The operation of sampling and compensating for the threshold voltage of the driving transistor DRT may be activated by the data voltage Vdata applied to the source electrode of the driving transistor DRT in a state in which the first switching transistor T1 is turned on.

One electrode of the storage capacitor Cst is provided with the high-potential driving voltage VDD, and the other electrode of the storage capacitor Cst is connected to the gate electrode of the driving transistor DRT. The storage capacitor Cst stores the voltage of the gate electrode of the driving transistor DRT.

The anode of the light-emitting element ED is connected to the drain electrode of the fourth switching transistor T4 and the drain electrode of the sixth switching transistor T6. A low-potential driving voltage VSS is applied to the cathode of the light-emitting element ED being turned on.

The light-emitting element ED generates light having a predetermined luminous intensity using the driving current flowing therethrough due to the driving transistor DRT.

Here, the stabilization voltage Vini is supplied to stabilize changes in capacitance created in the gate electrode of the driving transistor DRT, while the reset voltage VAR is supplied to reset the anode of the light-emitting element ED.

When the reset voltage VAR is supplied to the anode of the light-emitting element ED in a state in which the fourth switching transistor T4 located between the anode of the light-emitting element ED and the driving transistor DRT to be controlled by the emission signal EM is turned off, the anode of the light-emitting element ED may be reset.

The sixth switching transistor T6 supplying the reset voltage VAR is connected to the anode of the light-emitting element ED.

The fourth scan signal SCAN4 for driving the driving transistor DRT or stabilizing the driving transistor DRT and the third scan signal SCAN3 for controlling the supply of the reset voltage VAR to the anode of the light-emitting element ED are separated so that the operation of driving the driving transistor DRT and the operation of resetting the anode of the light-emitting element ED may be performed separately.

In this case, the subpixel SP may be configured such that when the switching transistors T5 and T6 supplying the stabilization voltage Vini and the reset voltage VAR are turned on, the fourth switching transistor T4 connecting the drain electrode of the driving transistor DRT and the anode of the light-emitting element ED is turned off to block flow of the driving current of the driving transistor DRT to the anode of the light-emitting element ED and prevent other voltages from having an effect on the anode than the reset voltage VAR.

The subpixel SP including the eight transistors DRT, T1, T2, T3, T4, T5, T6, and T7 and the single capacitor Cst as described above may be referred to as having an 8T1C structure.

The 8T1C structure among a variety of circuit structures of the subpixel SP has been illustrated hereinabove, and the structure and number of the transistors and the capacitors of the subpixel SP may be changed variously. Respective subpixels among the plurality of subpixels SP may have the same structure or some subpixels among the plurality of subpixels SP may have a different structure. For example, the number of transistors in the subpixel circuit of the present disclosure may be eight or more, and the number of capacitors may be one or more, for example, the subpixel circuit of the present disclosure may also have a 8T2C structure including eight transistors and two capacitors, a 9T1C structure including nine transistors and one capacitors, or the like.

Figure 4:
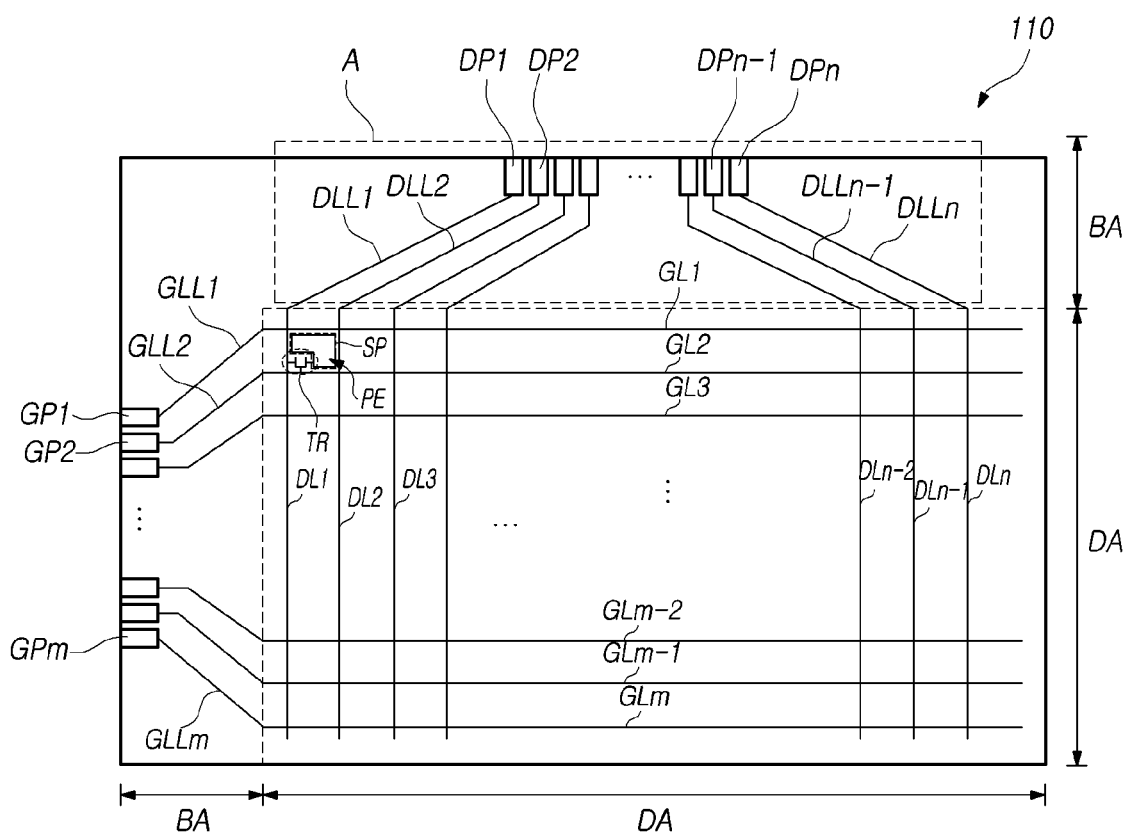
FIG. 4 is a plan diagram illustrating a display panel.

FIG. 4 is a plan diagram illustrating a display panel.

Referring to FIG. 4, the display panel 110 may be divided into a display area DA on which images are displayed and a bezel area BA outside the display area DA and on which no images are displayed.

In the display area DA, first to $m^{th}$ gate lines GL1 to GLm to which gate signals are applied in one direction and first to nth data lines DL1 to DLn to which data signals are applied may be arranged in the form of a matrix. The first to nth data lines DL1 to DLn intersect the first to mth gate lines GL1 to GLm to define a plurality of subpixels SP.

A plurality of transistors TR for driving the subpixels SP are provided at intersections of the first to mth gate lines GL1 to GLm and the first to nth data lines DL1 to DLn. Pixel electrodes PE in contact with the transistors are provided to correspond to the subpixels SP in a one-to-one relationship.

The first to mth gate lines GL1 to GLm and the first to nth data lines DL1 to DLn are connected to first to mth gate pads GP1 to GPm and first to nth data pads DP1 to DPn through first to mth gate link lines GLL1 to GLLm and first to nth data link lines DLL1 to DLLn formed in the bezel area BA.

Here, the first to mth gate pads GP1 to GPm are electrically connected to the gate driving circuit 120. An area in which the first to mth gate pads GP1 to GPm are formed corresponds to the area of the gate driving circuit 120.

In addition, the first to nth data pads DP1 to DPn are electrically connected to the data driving circuit 130. An area in which the first to nth data pads DP1 to DPn are formed corresponds to the area of the data driving circuit 130.

Figure 5:
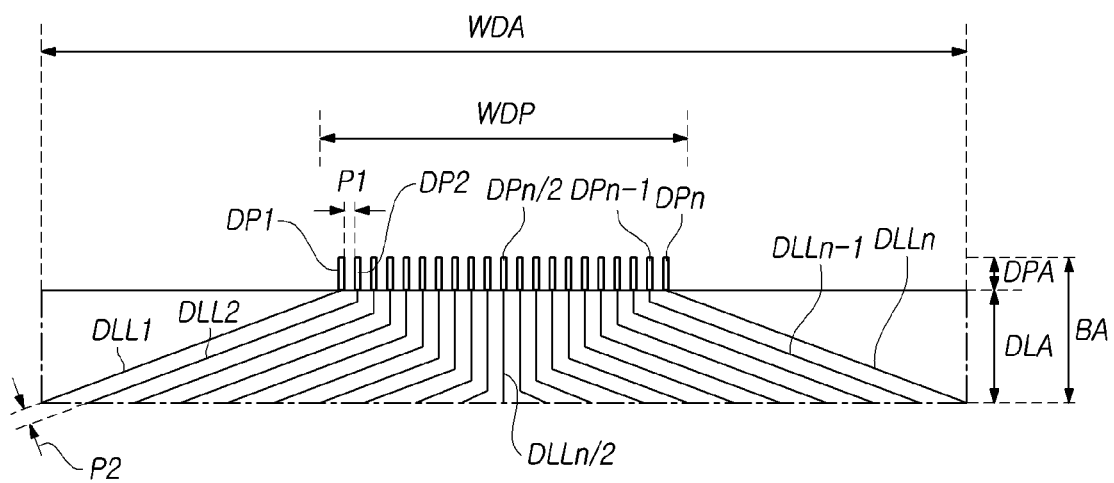
FIG. 5 is an enlarged diagram of the part A in FIG. 4.

FIG. 5 is an enlarged diagram of the part A in FIG. 4.

Referring to FIG. 5, the bezel area BA adjacent to the data driving circuit 130 may include a data link area DLA in which the data link lines DLL1 to DLLn are formed and a data pad part DPA in which the data pads DP1 to DPn are formed.

The first to nth data pads DP1 to DPn formed in the data pad part DPA are spaced apart from each other at predetermined pad pitches P1.

The first to nth data link lines DLL1 to DLLn corresponding to the first to nth data pads DP1 to DPn in a one-to-one relationship serve to apply data signals to the first to nth data lines DL1 to DLn.

The width WDP of a data pad part in which the first to nth data pads DP1 to DPn are arranged in the horizontal direction corresponds to the width of the data driving circuit (130 in FIG. 2). Since the width of the data driving circuit (130 in FIG. 2) is narrower than the width WDA of the display area, the width WDP of the data pad part is narrower than the width WDA of the display area.

Thus, in the display panel 110 of the related art, the first to nth data link lines DLL1 to DLLn have a slant structure. That is, the first to nth data link lines DLL1 to DLLn extend in the form of slants from the first to nth data pads DP1 to DPn toward the display panel 110.

Here, the first to nth data link lines DLL1 to DLLn may be designed with the same widths, the first to nth data link lines DLL1 to DLLn may be spaced apart from each other at uniform link pitches P2.

According to this slant structure, the lengths of the data link lines increase in the direction of from the n/(2−1)th data link line DLLn/2−1 to the first data link line DLL1 with respect to the n/2th data link line DLLn/2. The lengths of the data link lines also increase in the direction of from the n/(2+1)th data link line DLLn/2+1 to the nth data link line DLLn with respect to the n/2th data link line DLLn/2.

Here, the thickness of the data link area DLA may be determined in consideration of the difference between the width WDP of the data pad part and the width WDA of the display area and the link pitches P2 of the data link lines DLL1 to DLLn.

For example, the greater the difference between the width WDP of the data pad part and the width WDA of the display area, the closer the outermost data link lines DLL1 and DLLn are to the horizon. Thus, it is required to increase the distances between the data pads and the display area DA in consideration of the link pitches P2 of the data link lines DLL1 to DLLn.

In particular, the greater the size or the higher the resolution of the display device 100, the greater the number of the data lines DL and the number of data link lines DLL are. As a result, the width of the data link area DLA is increased, thereby increasing the size of the bezel area BA.

To solve this problem, a narrow bezel may be implemented by disposing some data link lines DLL in the display area DA of the display panel 110. However, when the data link lines DLL are disposed in the display area DA of the display panel 110, coupling capacitance may be formed between signal lines arranged in parallel at adjacent positions and it may induce deterioration in image quality.

Thus, the display device 100 according to the present disclosure may implement a narrow bezel and improve image quality by forming a part of data link lines DLL located in a display area DA of a display panel 110 in stepped structures.

Figure 6:
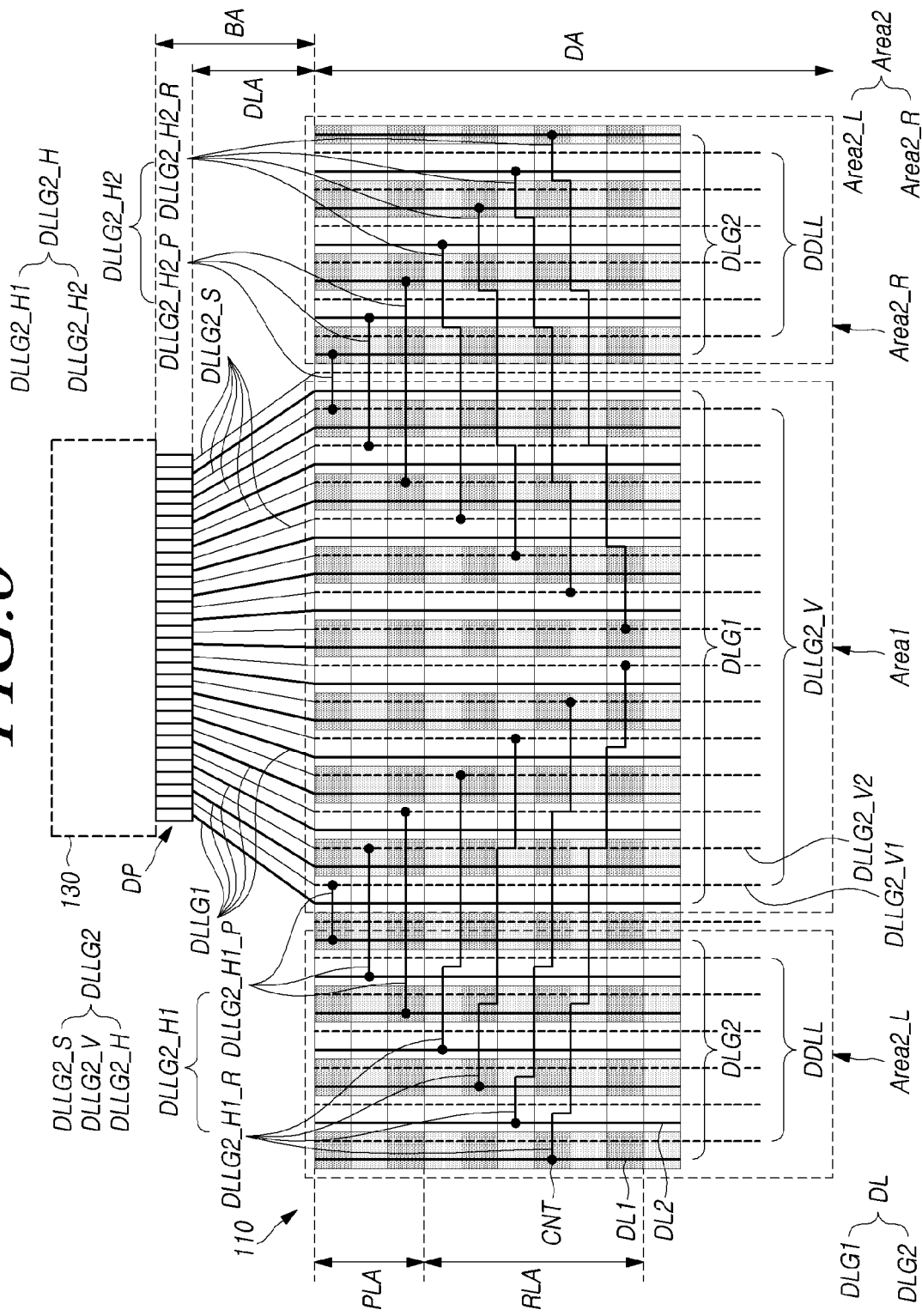
FIG. 6 is a plan diagram illustrating a structure of the display panel according to aspects.

FIG. 6 is a plan diagram illustrating a structure of the display panel according to aspects.

Referring to FIG. 6, the display panel 110 according to the present disclosure may be divided into a display area DA on which images are displayed and a bezel area BA outside the display area DA and on which no images are displayed.

A plurality of data lines DL extending in a first direction (e.g., a column direction) to receive data signals output from the data driving circuit 130 may be disposed in the display area DA. A plurality of gate lines GL extending in a second direction (e.g., a row direction) to receive gate signals output from the gate driving circuit 120 may be disposed in the display area DA. A plurality of subpixels SP may be formed in areas in which the gate lines GL intersect the data lines DL.

Here, for the convenience of description, the gate lines GL are omitted, and only the data link lines DLL and data lines DL are depicted in display area DA.

The plurality of data lines DL may extend in parallel in the first direction (e.g., a column direction) of the display panel 110 from the data driving circuit 130.

The plurality of data lines DL may include a first data line group DLG1 disposed in a first area Area1 corresponding to the data driving circuit 130 and a second data line group DLG2 disposed in second areas Area2 located on outside of the first area Area1.

In the display device 100 according to the present disclosure, the first data line group DLG1 disposed in the first area Area1 corresponding to the data driving circuit 130 is connected to a first data link line group DLLG1 having a linear structure and the second data line group DLG2 disposed in the second areas Area2 located on outside of the first area Area1 is connected to a second data link line group DLLG2 having a bending structure to form the area in which the data driving circuit 130 is located into a narrow bezel.

The first area Area1 corresponding to the data driving circuit 130 is an area of the display area DA of the display panel 110 corresponding to the width of the data driving circuit 130. Since the first area Area1 corresponds to the data driving circuit 130 in the first direction (e.g., a column direction), the first data line group DLG1 disposed in the first area Area1 may be connected to the data driving circuit 130 using the first data link line group DLLG1 having a linear structure.

The first data link line group DLLG1 extends from the data driving circuit 130 and is connected to the first data line group DLG1 of the first area Area1 corresponding to the data driving circuit 130. Thus, the first data link line group DLLG1 may be located in the data link area DLA.

The second areas Area2 located on outside of the first area Area1 correspond to portions of the display area DA disposed on both sides of the first area Area1. The second area Area2 may include a left second area Area2_L located on the left side of the display panel 110 and a right second area Area2_R located on the right side of the display panel 110.

The display device 100 according to the present disclosure includes the second data link line group DLLG2 having a bending structure and connecting the second data line group DLG2 disposed in the second areas Area2 to the data driving circuit 130.

The second data link line group DLLG2 may include straight (2−1)th data link lines DLLG2_S, vertical (2−2)th data link lines DLLG2_V, and horizontal (2−3)th data link lines DLLG2_H to connect the second data line group DLG2 of the second areas Area2 located on outside of the first area Area1.

The straight (2−1)th data link lines DLLG2_S extend from the data pad part DP connected to the data driving circuit 130 to the first area Area1 corresponding to the data driving circuit 130. The straight (2−1)th data link lines DLLG2_S may be located in the data link area DLA.

The vertical (2−2)th data link lines DLLG2_V are disposed in the first direction (e.g., a column direction) to be in parallel to the first data line group DLG1 of the first area Area1 corresponding to the data driving circuit 130. The vertical (2−2)th data link lines DLLG2_V are formed in the display area DA. Here, the vertical (2−2)th data link lines DLLG2_V may be disposed to alternate with data lines of the first data line group DLG1.

The straight (2−1)th data link lines DLLG2_S extend in a slant direction from the data driving circuit 130 and are connected to the vertical (2−2)th data link lines DLLG2_V in the first area Area1 corresponding to the data driving circuit 130.

The horizontal (2−3)th data link lines DLLG2_H extend in the second direction (e.g., a row direction) and are connected to the second data line group DLG2 of the second areas Area2 located on outside of the first area Area1. The horizontal (2−3)th data link lines DLLG2_H may be formed in the display area DA.

The second data line group DLG2 of the second areas Area2 located on outside of the first area Area1 may be connected to the data driving circuit 130 through straight (2-1)th data link lines DLLG2_S extending from the data pad part DP, the vertical (2-2)th data link lines DLLG2_V disposed in parallel to the first data line group DLG1, and the horizontal (2-3)th data link lines DLLG2_H extending in the second direction (e.g., a row direction).

At this time, coupling capacitance may be formed by an adjacent signal line extending in parallel with the horizontal (2-3)th data link lines DLLG2_H located in the display area DA. In particular, the coupling capacitance increases as the length of the parallel signal lines disposed in parallel with the horizontal (2-3)th data link lines DLLG2_H increases. Accordingly, as the length of the horizontal (2-3)th data link lines DLLG2_H increases, the coupling capacitance with the adjacent signal line may increase.

Accordingly, the display device 100 of the present disclosure may reduce coupling capacitance between adjacent signal lines and improve image quality by forming the at least partial horizontal (2-3)th data link lines DLLG2_H extending beyond the reference length among the horizontal (2-3)th data link lines DLLG2_H disposed in the display area DA in a stepped structure.

At this time, the horizontal (2-3)th data link lines DLLG2_H disposed in the display area DA may be formed shorter at positions close to the data pad DP, and longer as they are farther from the data pad DP.

Accordingly, since the horizontal (2-3)th data link lines DLLG2_H formed in a position close to the data pad DP have a short length parallel to the adjacent signal line, the coupling capacitance may be small.

On the other hand, since the horizontal (2-3)th data link lines DLLG2_H formed far from the data pad DP have a long length parallel to an adjacent signal line, the coupling capacitance may be large.

Accordingly, the horizontal (2-3)th data link lines DLLG2_H located within a reference distance from the data pad DP may be formed in a straight structure, but the horizontal (2-3)th data link lines DLLG2_H located away from the data pad DP by the reference distance or more may be formed in a stepped structure.

For example, horizontal (2-3)th data link lines DLLG2_H1_P disposed in a linear structure area PLA within a reference distance from the data pad DP among the horizontal (2-3)th data link lines DLLG2_H1 located on the left side of the display panel 110 may be formed in a linear structure, and horizontal (2-3)th data link lines DLLG2_H1_R disposed in a stepped structure area RLA away from the data pad DP by the reference distance or more may be formed in a stepped structure.

In addition, horizontal (2-3)th data link lines DLLG2_H2_P disposed in the linear structure area PLA within a reference distance from the data pad DP among the horizontal (2-3)th data link lines DLLG2_H2 located on the right side of the display panel 110 may be formed in a linear structure, and horizontal (2-3)th data link lines DLLG2_H2_R disposed in a stepped structure area RLA away from the data pad DP by the reference distance or more may be formed in a stepped structure.

At this time, the horizontal (2-3)th data link lines DLLG2_H1_R, DLLG2_H2_R having a stepped structure may have a structure that becomes farther away from the center of the display panel 110 or that becomes farther away from the outer edge of the display panel 110. Here, it illustrates a case as an example in which the horizontal (2-3)th data link lines DLLG2_H1_R, DLLG2_H2_R are formed in a stepped structure that becomes farther away from the center of the display panel 110.

At this time, the structure of the horizontal (2-3)th data link lines DLLG2_H1 arranged in the left side of the display panel 110 may be symmetrical with the structure of the horizontal (2-3)th data link lines DLLG2_H2 arranged in the right side of the display panel 110 with respect to the center of the display panel 110.

The horizontal (2-3)th data link lines DLLG2_H may be connected to the vertical (2-2)th data link lines DLLG2_V and the second data line group DLG2 through contact holes. In addition, the horizontal (2-3)th data link lines DLLG2_H may be formed on a different layer from the vertical (2-2)th data link lines DLLG2_V and the second data line group DLG2.

In addition, in consideration of capacitance due to the vertical (2-2)th data link lines DLLG2_V disposed in the first area Area1 corresponding to the data driving circuit 130, dummy data link lines DDLL may be further disposed to alternate with data lines of the second data line group DLG2 of the second areas Area2 located on outside of the first area Area1.

As described above, when the second data line group DLG2 of the second areas Area2 located on outside of the first area Area1 is connected using the straight (2-1)th data link lines DLLG2_S extending from the data pad part DP, the vertical (2-2)th data link lines DLLG2_V disposed in parallel to the first data line group DLG1, and the horizontal (2-3)th data link lines DLLG2_H extending in the horizontal direction, link pitches between the data link lines may be obtained even in the case in which the distances between the data pads and the display area DA are reduced.

Thus, the width of the data link area DLA may be reduced, thereby realizing a narrow bezel.

Figure 7:
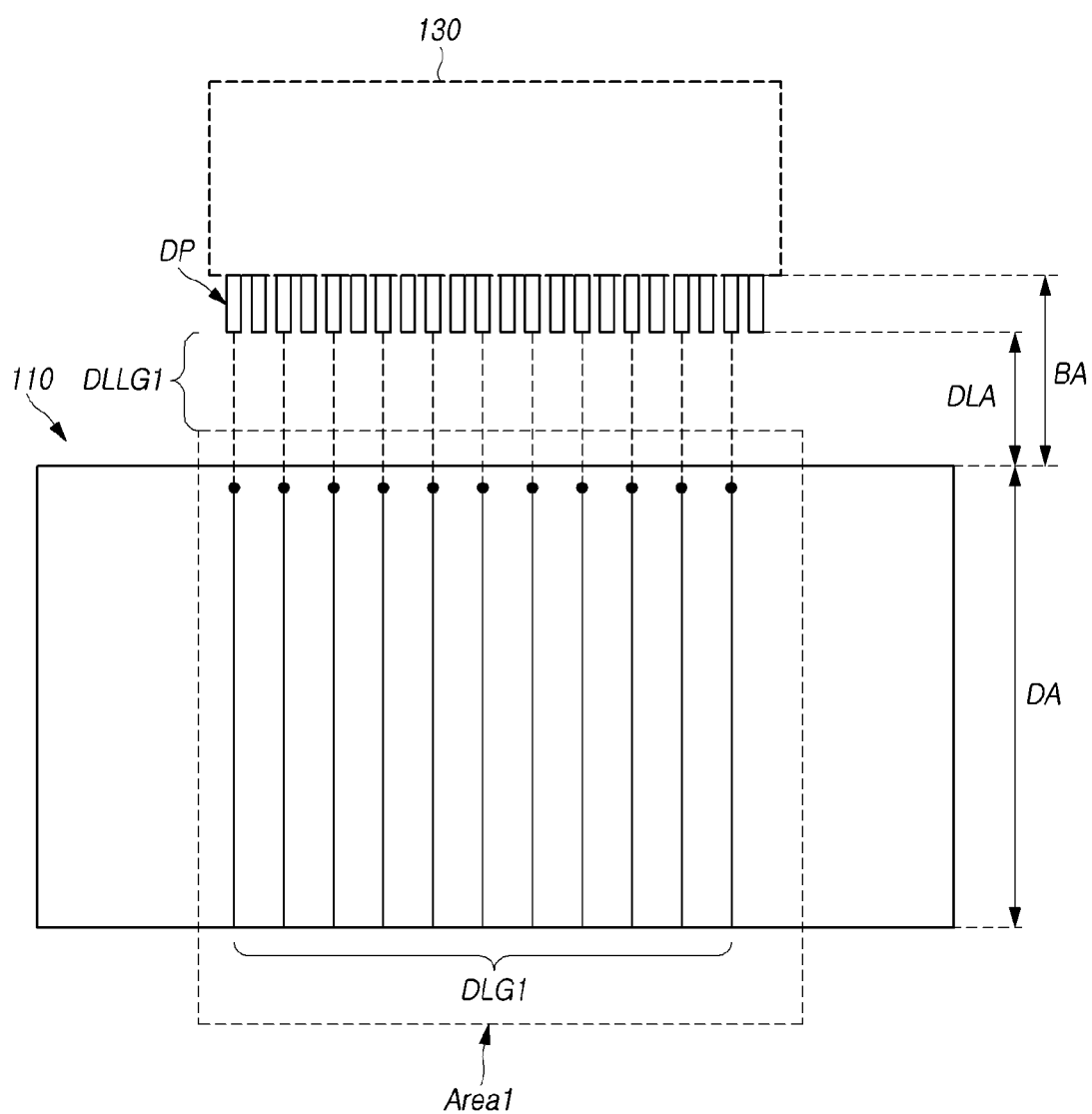
FIG. 7 is a diagram separately illustrating a connecting structure of data lines disposed in the first area corresponding to the data driving circuit in the display device according to aspects.
Figure 8:
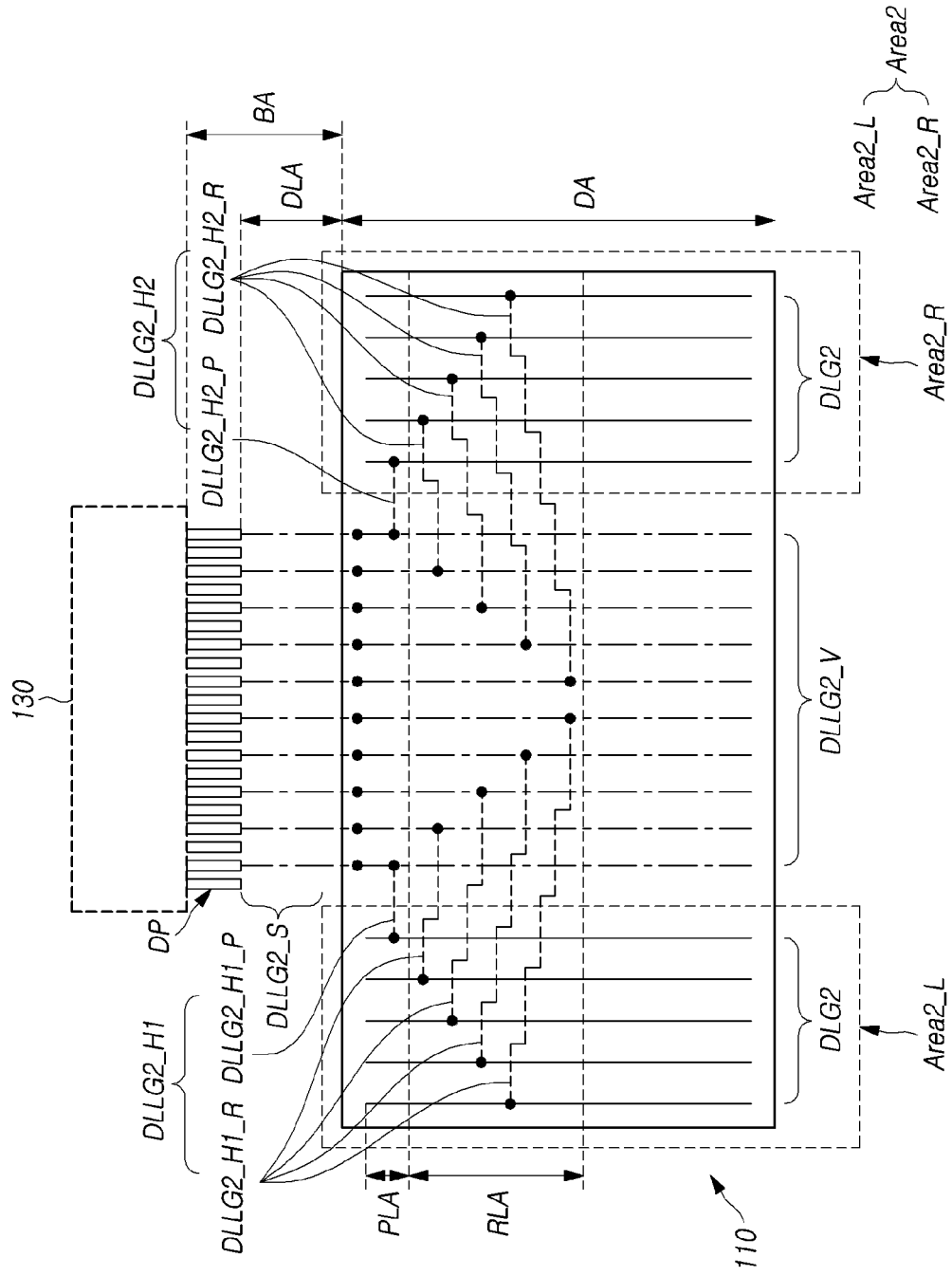
FIG. 8 is a diagram separately illustrating a connecting structure of data lines disposed in the second areas located on outside on the first area in the display device according to aspects.

FIG. 7 is a diagram separately illustrating a connecting structure of data lines disposed in the first area corresponding to the data driving circuit in the display device according to aspects, and FIG. 8 is a diagram separately illustrating a connecting structure of data lines disposed in the second areas located on outside of the first area in the display device according to aspects.

In FIGS. 7 and 8, the first area Area1 corresponding to the data driving circuit 130 and the second areas Area2 located on outside of the first area Area1 are separately illustrated for the convenience of description.

First, referring to FIG. 7, in the display device 100 according to aspects, the first area Area1 corresponding to the data driving circuit 130 is a portion of the display area DA of the display panel 110 corresponding to the width of the data driving circuit 130. Since the first area Area1 is an area corresponding to the data driving circuit 130 in the first direction (e.g., a column direction), the first data line group DLG1 disposed in the first area Area1 may be connected to the data pad part DP through the first data link line group DLLG1 having a linear structure.

The first data link line group DLLG1 extends from the data pad part DP, and is directly connected to the first data line group DLG1 disposed in the first area Area1 corresponding to the data driving circuit 130. Thus, the first data link line group DLLG1 may be disposed in the data link area DLA.

Referring to FIG. 8, in the display device 100 according to aspects, the second areas Area2 located on outside of the first area Area1 correspond to portions of the display area DA of the display panel 110 disposed on both sides of the first area Area1. The second area Area2 may include a left second area Area2_L located on the left side of the display panel 110 and a right second area Area2_R located on the right side of the display panel 110.

The second data line group DLG2 disposed in the second areas Area2 is connected to the data pad part DP through the second data link line group DLLG2 having a bending structure.

The second data link line group DLLG2 may include the straight (2-1)th data link lines DLLG2_S, the vertical (2-2)th data link lines DLLG2_V, and the horizontal (2-3)th data link lines DLLG2_H.

The straight (2-1)th data link lines DLLG2_S extend from the data pad part DP to the first area Area1 corresponding to the data driving circuit 130. The straight (2-1)th data link lines DLLG2_S may be disposed in the data link area DLA.

The vertical (2-2)th data link lines DLLG2_V are disposed in parallel to the first data line group DLG1 in the first area Area1.

The straight (2-1)th data link lines DLLG2_S are connected to the vertical (2-2)th data link lines DLLG2_V in the first area Area1.

The horizontal (2-3)th data link lines DLLG2_H extend in the second direction (e.g., a row direction) and are connected to the second data line group DLG2 of the second areas Area2.

In the display device 100 of the present disclosure, at least part of the horizontal (2-3)th data link lines DLLG2_H may be formed in stepped structure to reduce coupling capacitance formed between the horizontal (2-3)th data link lines DLLG2_H and adjacent signal lines.

For example, some horizontal (2-3)th data link lines DLLG2_H1_P disposed in the linear structure area PLA which is within a reference distance from the data pad DP among the horizontal (2-3)th data link lines DLLG2_H1 located on the left side of the display panel 110 may be formed in a linear structure. And some horizontal (2-3)th data link lines DLLG2_H1_R disposed in the stepped structure area RLA which is away from the data pad DP by a reference distance or more may be formed in a stepped structure.

In addition, some horizontal (2-3)th data link lines DLLG2_H2_P disposed in the linear structure area PLA which is within a reference distance from the data pad DP among the horizontal (2-3)th data link lines DLLG2_H2 located on the right side of the display panel 110 may be formed in a linear structure. And, some horizontal (2-3)th data link lines DLLG2_H2_R disposed in the stepped structure area RLA which is away from the data pad DP by a reference distance or more may be formed in a stepped structure.

In this way, when some horizontal (2-3)th data link lines DLLG2_H extending beyond the reference distance among the horizontal (2-3)th data link lines DLLG2_H disposed in the display area DA are formed in a stepped structure, coupling capacitance between adjacent signal lines may be reduced.

Figure 9:
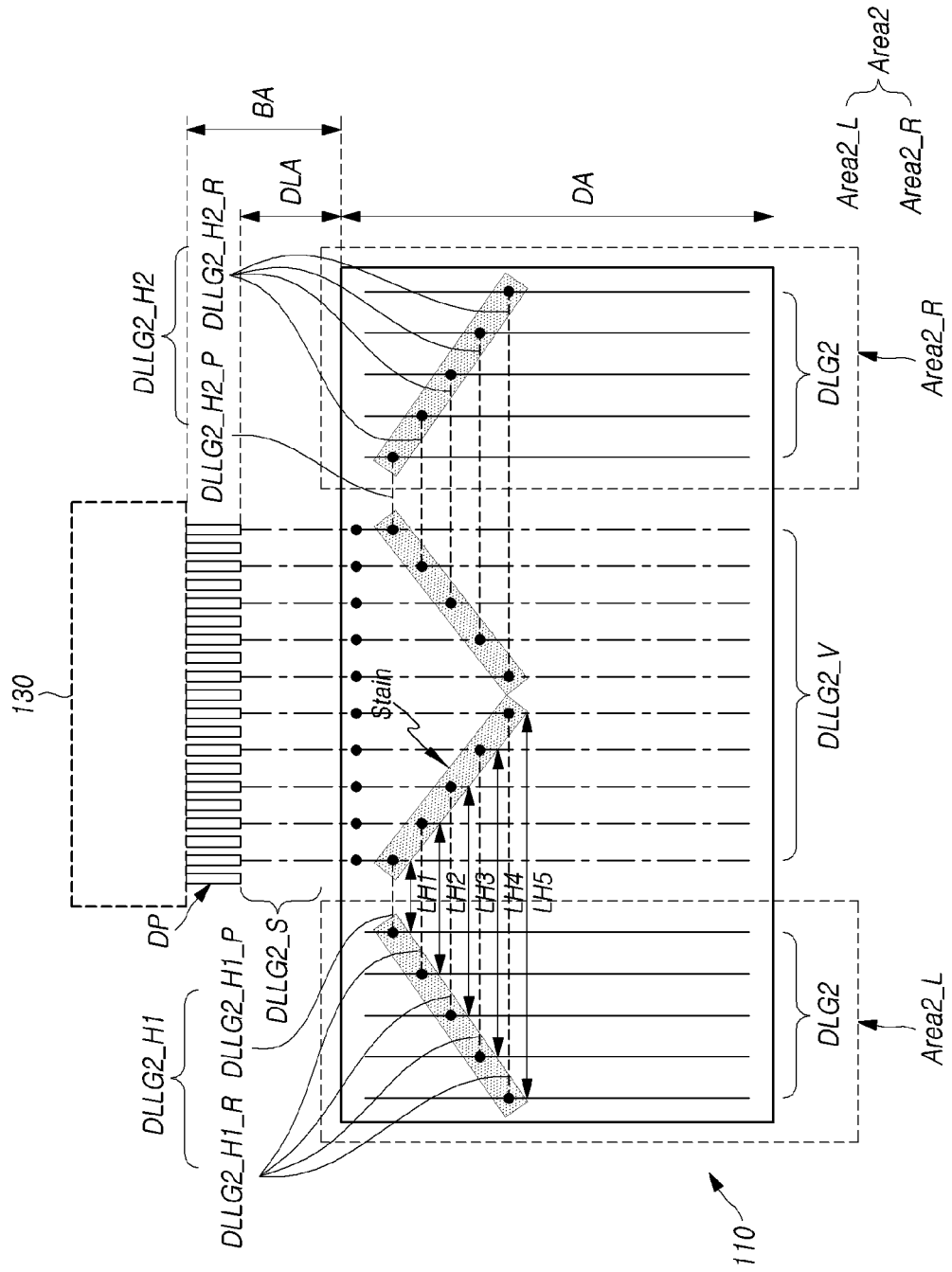
FIG. 9 is a diagram illustrating a case in which a stain is formed in an area due to the horizontal (2-3)th data link lines with linear structure in the display device according to aspects.

FIG. 9 is a diagram illustrating a case in which a stain is formed in an area due to the horizontal (2-3)th data link lines with linear structure in the display device according to aspects.

Referring to FIG. 9, in the display device 100 according to aspects, the first data line group DLG1 disposed in the first area Area1 corresponding to the data driving circuit 130 may be connected using the first data link line group DLLG1 having a linear structure, and the second data line group DLG2 disposed in the second areas Area2 located on outside of the first area Area1 may be connected using the second data link line group DLLG2 having a bending structure.

Here, the second data link line group DLLG2 may include the straight (2-1) th data link lines DLLG2_S, the vertical (2-2) th data link lines DLLG2_V, and the horizontal (2-3) th data link lines DLLG2_H to connect the second data line group DLG2 of the second areas Area2 located on outside of the first area Area1.

At this time, the lengths (LH1-LH3) of the horizontal (2-3)th data link lines DLLG2_H connecting between the vertical (2-2)th data link lines DLLG2_V disposed in the first area Area1 and a second data line group DLG2 disposed in the second area Area2 may be different with each other.

Particularly, when the horizontal (2-3)th data link lines DLLG2_H is formed in a linear structure within the display area DA of the display panel 110, image quality may be degraded due to coupling capacitance between signal lines disposed in parallel at adjacent positions.

As a result, stains having different luminance may appear along a bending point where the second data line group DLG2 and the horizontal (2-3)th data link lines DLLG2_H are connected.

Figure 10:
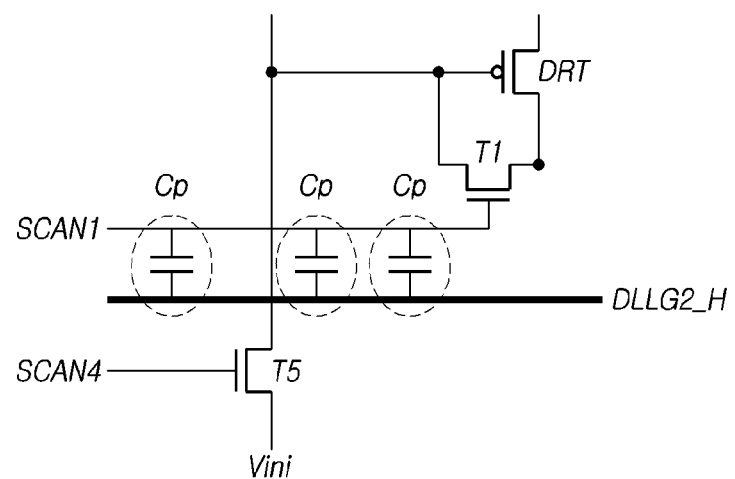
FIG. 10 is a circuit diagram illustrating a phenomenon in which coupling capacitance is formed due to the horizontal (2-3)th data link lines having a linear structure in the display area of the display panel.
Figure 11:
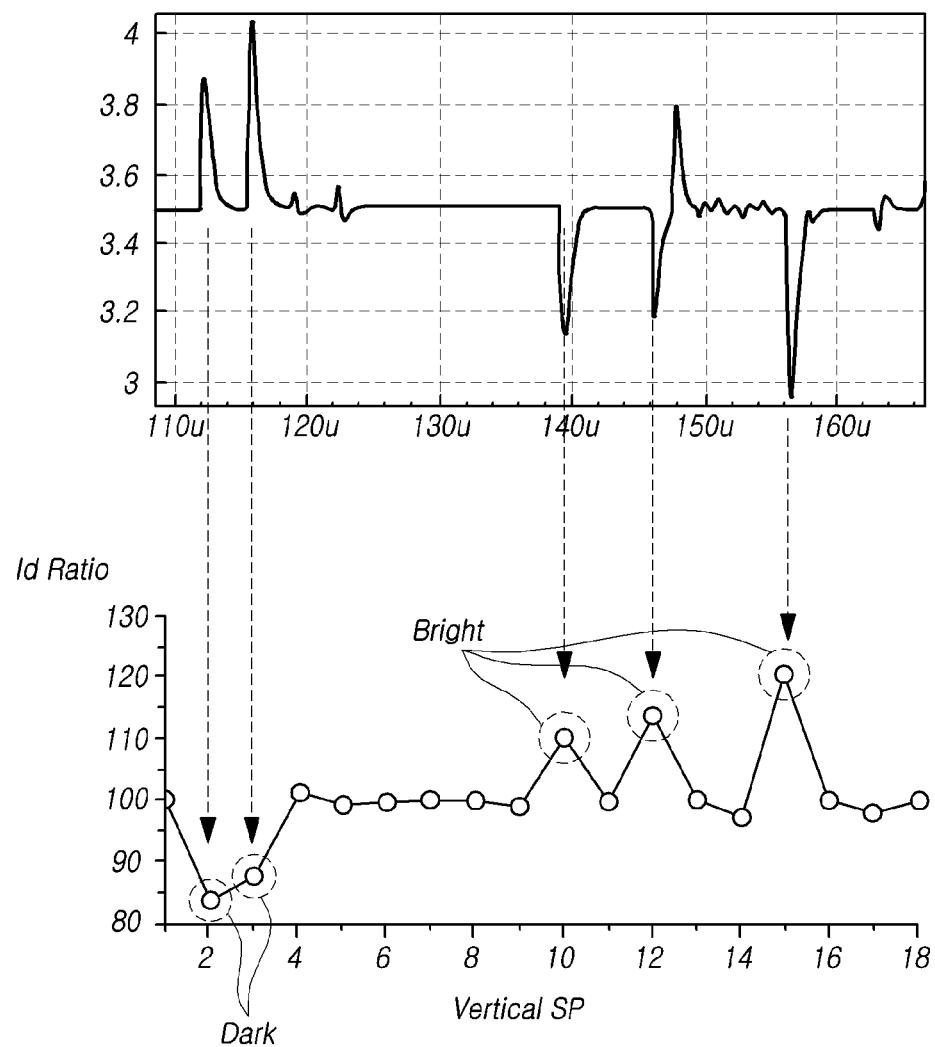
FIG. 11 is an experimental diagram illustrating a variation of driving current flowing in subpixels in a column direction when the horizontal (2-3)th data link lines are formed in a linear structure in the display area of the display panel.

FIG. 10 is a circuit diagram illustrating a phenomenon in which coupling capacitance is formed due to the horizontal (2-3)th data link lines having a linear structure in the display area of the display panel, and FIG. 11 is an experimental diagram illustrating a variation of driving current flowing in subpixels in a column direction when the horizontal (2-3)th data link lines are formed in a linear structure in the display area of the display panel.

Referring to FIGS. 10 and 11, when the horizontal (2-3)th data link lines DLLG2_H are formed in a linear structure within the display area DA of the display panel 110, coupling capacitance may be formed with a signal lines disposed in parallel at an adjacent position.

For example, various signal lines for transmitting scan signals may be located in the subpixel SP, and the horizontal (2-3)th data link lines DLLG2_H may be arranged in parallel with a signal line supplying a first scan signal SCAN1 to a first switching transistor T1. As such, when the horizontal (2-3)th data link lines DLLG2_H are arranged parallel to the signal line supplying the first scan signal SCAN1, coupling capacitance Cp is formed between the horizontal (2-3)th data link lines DLLG2_H and the signal line supplying the first scan signal SCAN1.

The coupling capacitance Cp increases in proportion to the length in which the horizontal (2-3)th data link lines DLLG2_H and the signal line supplying the first scan signal SCAN1 are arranged side by side.

As such, in a state where the coupling capacitance Cp is formed between the horizontal (2-3)th data link lines DLLG2_H and the signal line supplying the first scan signal SCAN1, when a data voltage Vdata is supplied through the horizontal (2-3)th data link lines DLLG2_H, the data voltage Vdata varies and the driving current Id flowing through the light emitting element ED changes due to the coupling capacitance Cp, resulting in luminance deviation.

As a result, a luminance difference occurs along the bending points where the second data line group DLG2 is connected to the horizontal (2-3)th data link lines DLLG2_H, and stains may appear.

On the other hand, signal lines that may be disposed in parallel to the horizontal (2-3)th data link lines DLLG2_H are not only the signal line supplying the first scan signal SCAN1, but also various signal lines, such as a signal line supplying a second scan signal SCAN2 or a signal line supplying a fourth scan signal SCAN4.

The display device 100 of the present disclosure may reduce the coupling capacitance formed between the horizontal (2-3)th data link lines DLLG2_H and other signal lines and improve image quality by forming at least part of the horizontal (2-3)th data link lines DLLG2_H connecting between the second data line group DLG2 disposed in the second area Area2 and the vertical (2-2)th data link lines DLLG2_V located in the first area Area1 in a stepped structure.

Figure 12:
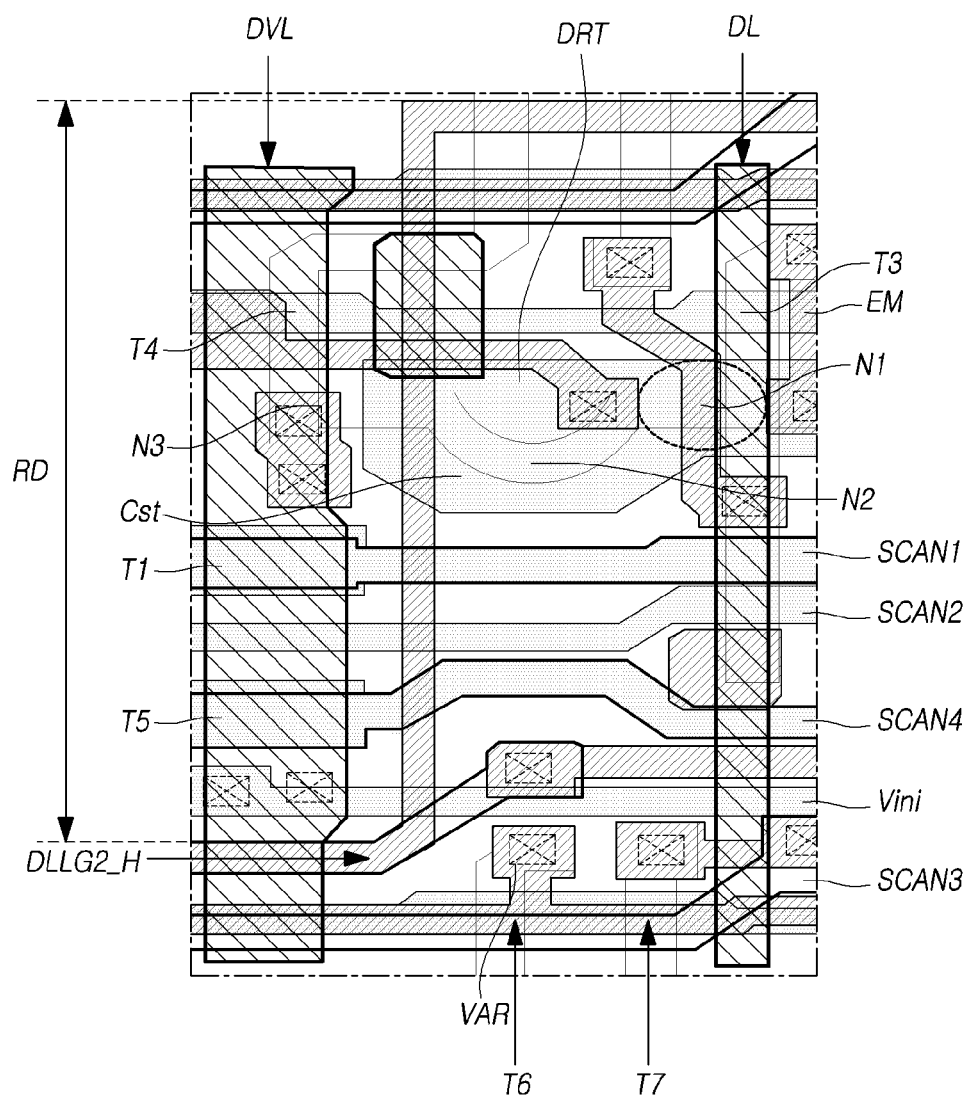
FIG. 12 is a diagram illustrating a plan view of a subpixel with horizontal (2-3)th data link lines having a stepped structure in a display device according to aspects of the present disclosure.

FIG. 12 is a diagram illustrating a plan view of a subpixel with horizontal (2-3)th data link lines having a stepped structure in a display device according to aspects of the present disclosure.

Here, it shows a plan view corresponding to the subpixel circuit shown in FIG. 3 as an example.

Referring to FIG. 12, the display device 100 according to aspects of the present disclosure may include at least a part of the horizontal (2-3) th data link lines DLLG2_H located in the display area DA formed in a stepped structure to reduce coupling capacitance between the horizontal (2-3) th data link lines DLLG2_H and adjacent signal lines.

That is, the display device 100 of the present disclosure may reduce the coupling capacitance between adjacent signal lines by forming the horizontal (2-3)th data link lines DLLG2_H located in the display area DA in a stepped structure having a constant step width RD according to positions.

In this way, when the horizontal (2-3)th data link lines DLLG2_H located in the display area DA are formed in a stepped structure having a constant step width RD, the coupling capacitance may be reduced because the length of the horizontal (2-3)th data link lines DLLG2_H arranged in parallel with adjacent signal lines are reduced.

At this time, the step width RD in the stepped structure of the horizontal (2-3)th data link lines DLLG2_H may be formed at a distance sufficient to reduce the coupling phenomenon by the adjacent signal line. For example, since the signal lines transmitting the scan signals SCAN are disposed for each subpixel SP of each row, the step width RD may be formed as greater than or equal to the width of the unit subpixel SP to reduce the coupling phenomenon caused by the adjacent signal line.

In addition, during a display driving period for displaying an image on the display panel 110 or a sensing driving period for detecting a characteristic value (threshold voltage or mobility) of the subpixel SP, the coupling capacitance Cp may increase at the time of the voltage of the source electrode N1 of the driving transistor DRT rises due to the data voltage Vdata applied to the driving transistor DRT while the first switching transistor T1 connecting the gate electrode and the drain electrode of the driving transistor DRT is turned on.

Therefore, the display device 100 of the present disclosure may have bending points where the horizontal (2-3)th data link lines DLLG2_H are bent in a stepped structure are spaced apart from the source electrode N1 of the driving transistor DRT by a predetermined distance or more.

Figure 13:
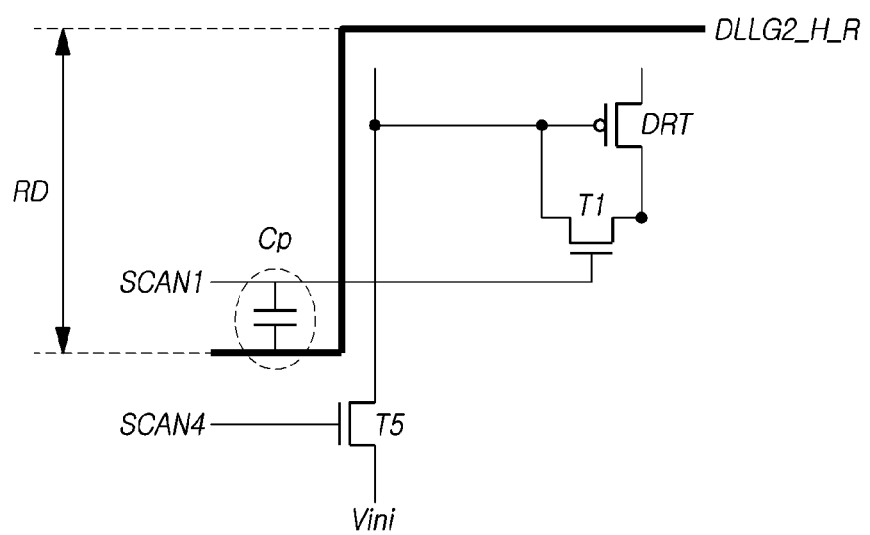
FIG. 13 is a circuit diagram illustrating a phenomenon in which coupling capacitance is formed due to the horizontal (2-3)th data link lines having a stepped structure in the display area of the display panel.
Figure 14:
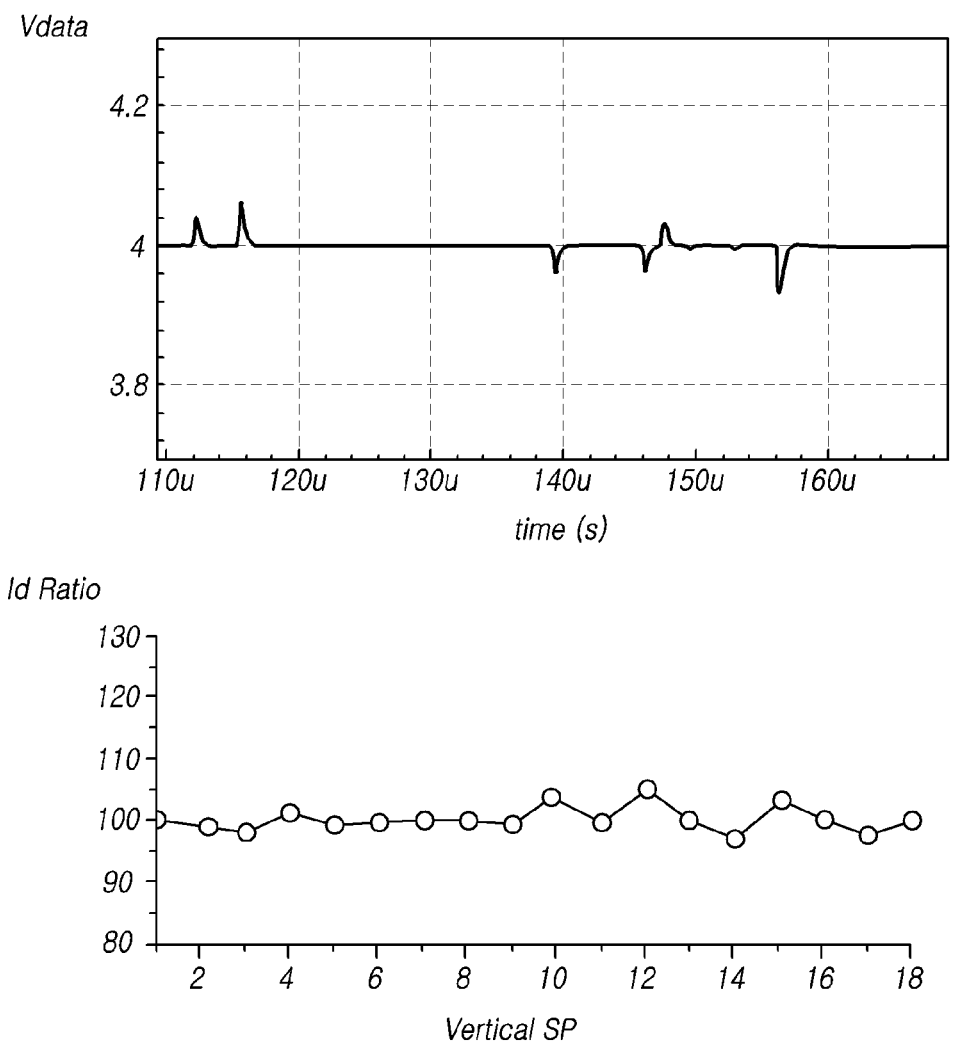
FIG. 14 is an experimental diagram illustrating a variation of driving current flowing in subpixels in a column direction when the horizontal (2-3)th data link lines are formed in a stepped structure in the display area of the display panel.

FIG. 13 is a circuit diagram illustrating a phenomenon in which coupling capacitance is formed due to the horizontal (2-3)th data link lines having a stepped structure in the display area of the display panel, and FIG. 14 is an experimental diagram illustrating a variation of driving current flowing in subpixels in a column direction when the horizontal (2-3)th data link lines are formed in a stepped structure in the display area of the display panel.

Referring to FIGS. 13 and 14, the horizontal (2-3)th data link lines (DLLG2_H in FIG. 10) within the display area DA of the display panel 110 of the display device 100 according to present disclosure may form a coupling capacitance with a signal lines disposed in parallel at an adjacent position.

The coupling capacitance Cp increases in proportion to the length in which the horizontal (2-3)th data link lines (DLLG2_H in FIG. 10) and the signal line supplying the first scan signal SCAN1 are arranged side by side.

However, in the display device 100 according to aspects of the present disclosure, at least a part of the horizontal (2-3)th data link lines (DLLG2_H in FIG. 10) located in the display area DA is formed in a stepped structure. Therefore, the length in which adjacent signal lines are arranged in parallel with the horizontal (2-3)th data link lines DLLG2_H_R having a stepped structure is shortened, so that the coupling capacitance may be reduced.

For example, the horizontal (2-3)th data link lines DLLG2_H_R having a stepped structure are arranged in parallel with the signal line supplying the first scan signal SCAN1 in a partial area, thereby coupling capacitance Cp may be formed. However, since the horizontal (2-3)th data link lines DLLG2_H_R are formed in a stepped structure having a constant step width RD, the length parallel to the signal line supplying the first scan signal SCAN1 is reduced and the coupling capacitance Cp may be reduced.

At this time, the step width RD of the horizontal (2-3) th data link lines DLLG2_H_R having a stepped structure may be greater than the width of the unit subpixel SP to reduce the coupling capacitance caused by the signal lines arranged in basis of subpixels SP.

In this way, in a state in which the coupling capacitance Cp formed between the horizontal (2-3)th data link lines DLLG2_H_R having a stepped structure and adjacent signal lines is reduced, image quality may be improved since the variation of the data voltage Vdata and the driving current Id is reduced while the data voltage Vdata is supplied to the horizontal (2-3)th data link lines (DLLG2_H of FIG. 10).

As a result, the luminance deviation occurring along the bending points where the second data line group (DLG2 in FIG. 6) are connected to the horizontal (2-3)th data link lines (DLG2_H in FIG. 6) is reduced and stains may decrease.

Accordingly, the display device 100 of the present disclosure may reduce the coupling capacitance formed between the horizontal (2-3)th data link lines (DLLG2_H in FIG. 6) and the adjacent signal lines, and improve image quality by forming at least a part of the horizontal (2-3)th data link lines (DLLG2_H in FIG. 6) connecting the second data line group (DLG2 in FIG. 6) disposed in the second area Area2 to the vertical (2-2)th data link lines (DLLG2_V in FIG. 6) located in the first area Area1 in a stepped structure.

Figure 15:
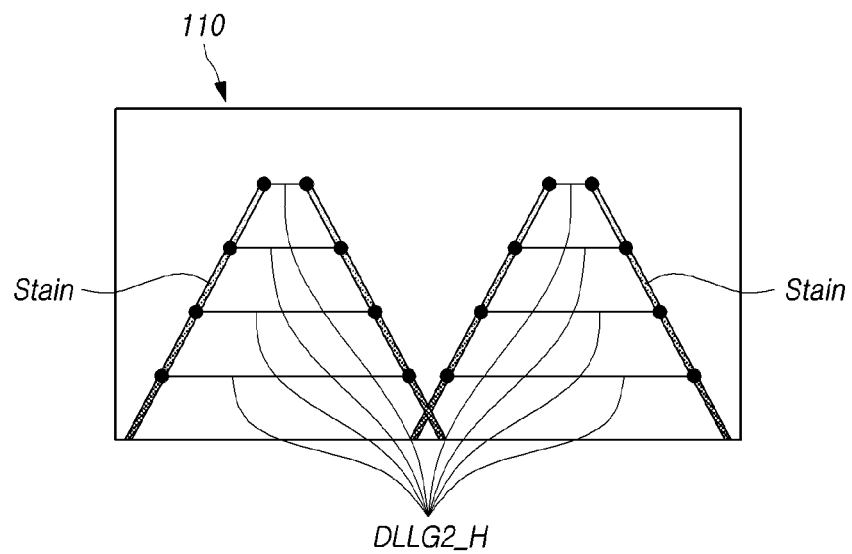
FIG. 15 is a diagram illustrating stains according to shapes of the horizontal (2-3)th data link lines in a display device according to aspects of the present disclosure.
Figure 15:
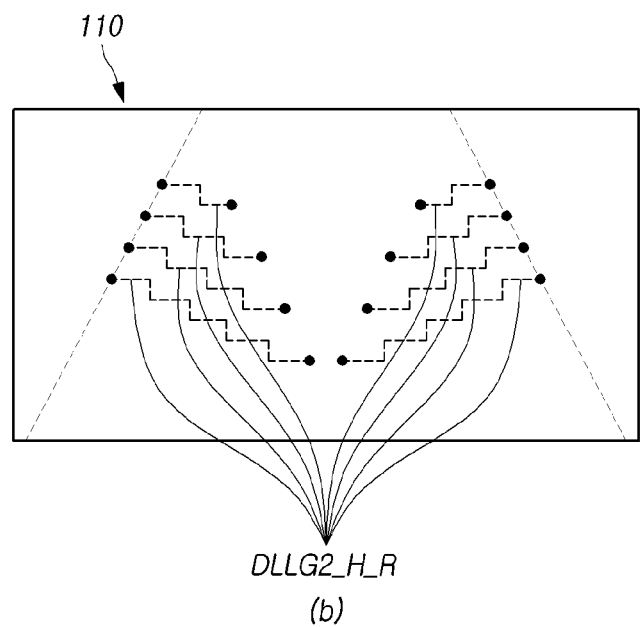

FIG. 15 is a diagram illustrating stains according to shapes of the horizontal (2-3)th data link lines in a display device according to aspects of the present disclosure.

Referring to FIG. 11, when the length of the horizontal (2-3)th data link lines DLLG2_H connecting between the vertical (2-2)th data link lines DLLG2_V disposed in the first area Area1 and the second data line group DLG2 disposed at the second area Area2 in the display device 100 according to aspects of the present disclosure vary according to positions, stains with different luminance may appear along the bending point at which the second data line group DLG2 is connected to the horizontal (2-3)th data link lines DLLG2_H (in the case of (a)).

On the other hand, when the horizontal (2-3)th data link lines DLLG2_H connecting the second data line group DLG2 disposed in the second area Area2 to the vertical (2-2)th data link lines DLLG2_V located in the first area Area1 is formed in a stepped structure, coupling capacitance formed between the horizontal (2-3)th data link lines DLLG2_H and other signal lines may be reduced. As a result, stains generated along the bending point VH at which the second data line group DLG2 is connected to the horizontal (2-3)th data link lines DLLG2_H may be reduced (in the case of (b)).

Figure 16:
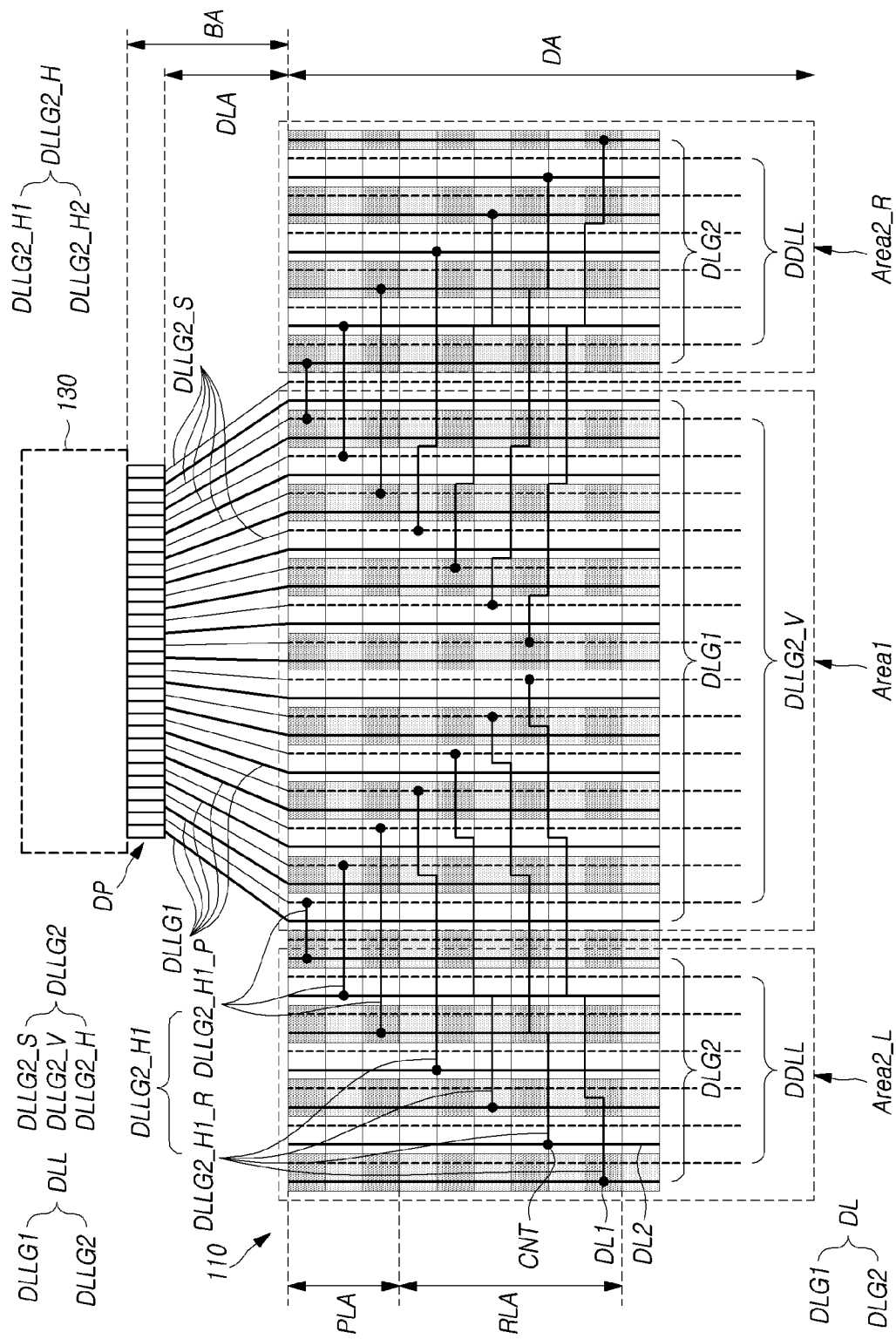
FIG. 16 is a plan view illustrating a structure of a display panel having a different arrangement structure of horizontal (2-3)th data link lines in a display device according to aspects of the present disclosure.

FIG. 16 is a plan view illustrating a structure of a display panel having a different arrangement structure of horizontal (2-3)th data link lines in a display device according to aspects of the present disclosure.

Referring to FIG. 16, the display panel 110 according to the present disclosure may be divided into a display area DA on which images are displayed and a bezel area BA outside the display area DA and on which no images are displayed.

The plurality of data lines DL may include a first data line group DLG1 disposed in a first area Area1 corresponding to the data driving circuit 130 and a second data line group DLG2 disposed in second areas Area2 located on outside of the first area Area1.

In the display device 100 according to the present disclosure, the first data line group DLG1 disposed in the first area Area1 corresponding to the data driving circuit 130 is connected to a first data link line group DLLG1 having a linear structure and the second data line group DLG2 disposed in the second areas Area2 located on outside of the first area Area1 is connected to a second data link line group DLLG2 having a bending structure.

The first data link line group DLLG1 extends from the data driving circuit 130 and is connected to the first data line group DLG1 of the first area Area1 corresponding to the data driving circuit 130. Thus, the first data link line group DLLG1 may be located in the data link area DLA.

The display device 100 according to the present disclosure includes the second data link line group DLLG2 having a bending structure and connecting the second data line group DLG2 disposed in the second areas Area2 to the data driving circuit 130.

The second data link line group DLLG2 may include straight (2-1)th data link lines DLLG2_S, vertical (2-2)th data link lines DLLG2_V, and horizontal (2-3)th data link lines DLLG2_H to connect the second data line group DLG2 of the second areas Area2 located on outside of the first area Area1.

The straight (2-1)th data link lines DLLG2_S extend from the data pad part DP connected to the data driving circuit 130 to the first area Area1 corresponding to the data driving circuit 130. The straight (2-1)th data link lines DLLG2_S may be located in the data link area DLA.

The vertical (2-2)th data link lines DLLG2_V are disposed in the first direction (e.g., a column direction) to be in parallel to the first data line group DLG1 of the first area Area1 corresponding to the data driving circuit 130. The vertical (2-2)th data link lines DLLG2_V are formed in the display area DA. Here, the vertical (2-2)th data link lines DLLG2_V may be disposed to alternate with data lines of the first data line group DLG1.

The straight (2-1)th data link lines DLLG2_S extend in a slant direction from the data driving circuit 130 and are connected to the vertical (2-2)th data link lines DLLG2_V in the first area Area1 corresponding to the data driving circuit 130.

The horizontal (2-3)th data link lines DLLG2_H extend in the second direction (e.g., a row direction) and are connected to the second data line group DLG2 of the second areas Area2 located on outside of the first area Area1.

The display device 100 of the present disclosure may reduce coupling capacitance between adjacent signal lines and improve image quality by forming the at least a part of horizontal (2-3)th data link lines DLLG2_H extending beyond the reference length among the horizontal (2-3)th data link lines DLLG2_H disposed in the display area DA in a stepped structure.

At this time, the horizontal (2-3)th data link lines DLLG2_H disposed in the display area DA may be formed shorter at positions close to the data pad DP, and longer as they are farther from the data pad DP.

Since the horizontal (2-3)th data link lines DLLG2_H formed in a position far from the data pad DP have a long length parallel to the adjacent signal line, the coupling capacitance may be large.

Accordingly, the horizontal (2-3)th data link lines DLLG2_H located within a reference distance from the data pad DP may be formed in a straight structure, but the horizontal (2-3)th data link lines DLLG2_H located away from the data pad DP by the reference distance or more may be formed in a stepped structure.

For example, horizontal (2-3)th data link lines DLLG2_H_P disposed in a linear structure area PLA within a reference distance from the data pad DP among the horizontal (2-3)th data link lines DLLG2_H may be formed in a linear structure, and horizontal (2-3)th data link lines DLLG2_H_R disposed in a stepped structure area RLA away from the data pad DP by the reference distance or more may be formed in a stepped structure.

At this time, the horizontal (2-3)th data link lines DLLG2_H_R having a stepped structure may have a structure that becomes farther away from the center of the display panel 110.

The above-described aspects of the present disclosure will be briefly reviewed as follows.

A display device according to aspects of the present disclosure is comprised of a data driving circuit configured to supply a plurality of data voltages to a plurality of data lines; a gate driving circuit configured to supply a plurality of gate signals to a plurality of gate lines; a display panel having a first data line group disposed in a first area corresponding to the data driving circuit, and a second data line group disposed in a second area located on outside of the first area; a timing controller configured to control the data driving circuit and the gate driving circuit; wherein the display panel includes a first data link line group ith a linear structure connecting to the first data line group; and a second data link line group with a bending structure including (2-3)th data link lines formed in a stepped structure for connecting the second data line group.

The first data link line group is connected between the data driving circuit and the first data line group in straight lines.

The second data link line group having a bending structure includes: (2-1)th data link lines extending from the data driving circuit; (2-2)th data link lines disposed in the first area and connected to the (2-1)th data link lines; and the (2-3)th data link lines connecting the (2-2)th data link lines and the second data line group.

The (2-1)th data link lines are disposed in a bezel area.

The (2-2)th data link lines are disposed in parallel to the first data line group in the first area.

The (2-3)th data link line includes straight (2-3)th data link lines; and stepped (2-3)th data link lines.

The straight (2-3)th data link lines are located in a linear structure area within a reference distance from the data driving circuit.

The stepped (2-3)th data link lines are located in a step structure area far from a reference distance or more from the data driving circuit.

The stepped (2-3)th data link lines are formed in a stepped structure with a constant step width.

The step width is greater than or equal to width of a unit subpixel.

The stepped (2-3)th data link lines are farther away from the center of the display panel.

The stepped (2-3)th data link lines are farther away from outer edge of the display panel.

The stepped (2-3)th data link lines are formed to be bent in the stepped structure at a position spaced apart from a source electrode of a driving transistor disposed in a subpixel by a reference distance or more.

The (2-3)th data link lines include a part of the (2-3)th data link lines disposed in the second area on a left side of the display panel and a part of the (2-3)th data link lines disposed in the second area on the right side of the display panel formed to be symmetrical based on a center of the display panel.

The (2-3)th data link lines are formed on a layer different from the second data line group.

The display device further includes dummy data link lines disposed between each of the second data line group in the second area.

A display panel according to aspects of the present disclosure is comprised of a plurality of subpixels; a first data line group disposed in a first area corresponding to a data driving circuit; a second data line group disposed in a second area located on outside of the first area; a plurality of gate lines; a first data link line group having a linear structure connected to the first data line group in a bezel area; and a second data link line group with a bending structure including (2-3)th data link lines formed in a stepped structure for connecting the second data line group.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure.

It will be apparent to those skilled in the art that various modifications and variations can be made in the display device and the display panel of the present disclosure without departing from the spirit or scope of the aspects. Thus, it is intended that the present disclosure covers the modifications and variations of the aspects provided they come within the scope of the appended claims and their equivalents.

What is claimed is:

1. A display device comprising:
    a data driving circuit configured to supply a plurality of data voltages to a plurality of data lines;
    a display panel including a display area where images are displayed and a bezel area disposed outside of the display area, the display area including a first area corresponding to the data driving circuit in which a first data line group of the plurality of data lines is disposed, and a second area located on outside the first area in which a second data line group of the plurality of data lines is disposed;
    wherein the display panel includes:
    a first data link line group with a linear structure connecting to the first data line group; and
    a second data link line group with a bending structure including second data link lines formed in one or more stepped structures for connecting the second data line group,
    wherein the second data link lines comprises:
    second-first data link lines extending from data pads connected to the data driving circuit to an edge of the display area in a straight line;
    second-second data link lines connected or integrated to the second-first data link lines and extending parallel to at least one of the plurality of data lines; and
    second-third data link lines interconnecting second-second data link lines to second data lines in included the second data line group,
    wherein the number of the stepped structures in the second-third data link lines increases gradually farther away from the data driving circuit.

2. The display device according to claim 1, wherein the first data link line group is connected between the data driving circuit and the first data line group in straight lines.

3. The display device according to claim 1, wherein the second-second data link lines are disposed in the first area and connected to the second-first data link lines.

4. The display device according to claim 3, wherein the second-first data link lines are disposed in the bezel area of the display panel.

5. The display device according to claim 3, wherein the second-second data link lines are disposed in parallel to the first data line group in the first area.

6. The display device according to claim 3, wherein the second-third data link lines include second-third data link lines that are straight and second-third data link lines in a stepped shape.

7. The display device according to claim 6, wherein the second-third data link lines are located within a reference distance from the data driving circuit.

8. The display device according to claim 6, wherein the second-third data link lines are located away from the data driving circuit by a reference distance or more.

9. The display device according to claim 6, wherein the second-third data link lines are formed in a stepped structure with a constant step width.

10. The display device according to claim 9, wherein the step width is greater than or equal to width of a unit subpixel.

11. The display device according to claim 6, wherein the second-third data link lines have a stepped structure gradually farther away from the center of the display panel.

12. The display device according to claim 6, wherein the second-third data link lines have a stepped structure gradually farther away from outer edge of the display panel.

13. The display device according to claim 6, wherein the second-third data link lines are formed to be bent in the stepped shape at a position spaced apart from a source electrode of a driving transistor disposed in a subpixel by a reference distance or more.

14. The display device according to claim 3, wherein the second-third data link lines include a part of the second-third data link line disposed in the second area on a left side of the display panel and a part of the second-third data link lines disposed in the second area on the right side of the display panel formed to be symmetrical based on a center of the display panel.

15. The display device according to claim 3, wherein the second-third data link lines are formed on a layer different from the second data line group.

16. The display device according to claim 3, further comprising dummy data link lines disposed between each of the second data line group in the second area.

17. The display device according to claim 3, wherein the second-third data link lines are formed on a layer different from the second-second data link lines.

18. The display device according to claim 1, wherein the second-first data link lines extend from data pads that are connected to the data driving circuit and extend in a straight line to an edge of the display area in a straight line.

19. The display device according to claim 1, wherein the first data link line group includes first data link lines having the linear structure and is connected first data pads connected to the data driving circuit,
wherein the second-first data link lines extend from second data pads connected to the data driving circuit to the edge of the display area, and
wherein first data pads and second data pads are disposed in alternated manner to each other.

20. The display device according to claim 1, further comprising dummy data link lines,
wherein among respective portions of the second data link lines having the stepped structure, corresponding portions disposed in the second area are disposed between the dummy data link lines.

21. A display panel comprising:
a display area where images are displayed and a bezel area disposed outside of the display area; the display area including a first area and a second area located on at least one side of the first area;
a first data line group, among a plurality of data lines, disposed in the first area corresponding to a data driving circuit;
a second data line group, among the plurality of data lines, disposed in the second area;
a first data link line group having a linear structure connected to the first data line group; and
a second data link line group with a bending structure including second data link lines formed in one or more stepped structures for connecting the second data line group,
wherein the second data link lines comprises:
second-first data link lines extending from data pads connected to the data driving circuit to an edge of the display area in a straight line;
second-second data link lines connected or integrated to the second-first data link lines and extending parallel to at least one of the plurality of data lines; and
second-third data link lines interconnecting second-second data link lines to second data lines in included the second data line group;
wherein the number of the stepped structures in the second-third data link lines increases gradually farther away from the data driving circuit.

22. The display panel according to claim 21,
the second-second data link lines are disposed in the first area and connected to the second-first data link lines.

23. The display panel according to claim 22, wherein the second-third data link lines are located within a reference distance from the data driving circuit, and
wherein the second-third data link lines are located away from the data driving circuit by a second reference distance or more.

* * * * *